United States Patent [19]
Tokuda

[11] Patent Number: 6,090,510
[45] Date of Patent: Jul. 18, 2000

[54] METHOD FOR SCANNING EXPOSURE

[75] Inventor: Noriaki Tokuda, Kanagawa-ken, Japan

[73] Assignee: Nikon Corporation, Tokyo, Japan

[21] Appl. No.: 09/047,476

[22] Filed: Mar. 25, 1998

[30] Foreign Application Priority Data

Mar. 25, 1997 [JP] Japan ................................. 9-071230
Mar. 25, 1997 [JP] Japan ................................. 9-071231

[51] Int. Cl.[7] ................................................. G03F 9/00
[52] U.S. Cl. ................................................ 430/30; 430/22
[58] Field of Search ............................. 430/22, 30

[56] References Cited

U.S. PATENT DOCUMENTS 5,728,495  3/1998  Ozawa ........................ 430/30
5,817,442  10/1998 Okino ........................ 430/30
5,879,842  3/1999  Okino ........................ 430/30

*Primary Examiner*—Christopher G. Young
*Attorney, Agent, or Firm*—Armstrong, Westerman, Hattori, McLeland & Naughton

[57] ABSTRACT

Even when there is a large change in unevenness on the surface of an area to be exposed, scanning exposure is carried out without reducing the throughput by accurately bringing the surface of the area into focus to the image plane. Focus position measuring areas (15F and 15R) are set apart from a slit-shaped illumination field (3) by respective sections (16F and 16R) with a predetermined width in the scanning direction. To carry out scanning exposure for a shot area on a wafer, the shot area is covered by the measuring area (15F), for example, at an approach start point of the wafer, and the focus position of the surface of the shot area is measured at detecting points ($P_{11}$ to $P_{53}$) in the measuring area (15F). On the basis of the result of the measurement, controlled variables for the surface position of the wafer are determined to bring the wafer surface in the illumination field (3) into focus to the image plane during scanning exposure by an autofocusing method and an autoleveling method.

18 Claims, 23 Drawing Sheets

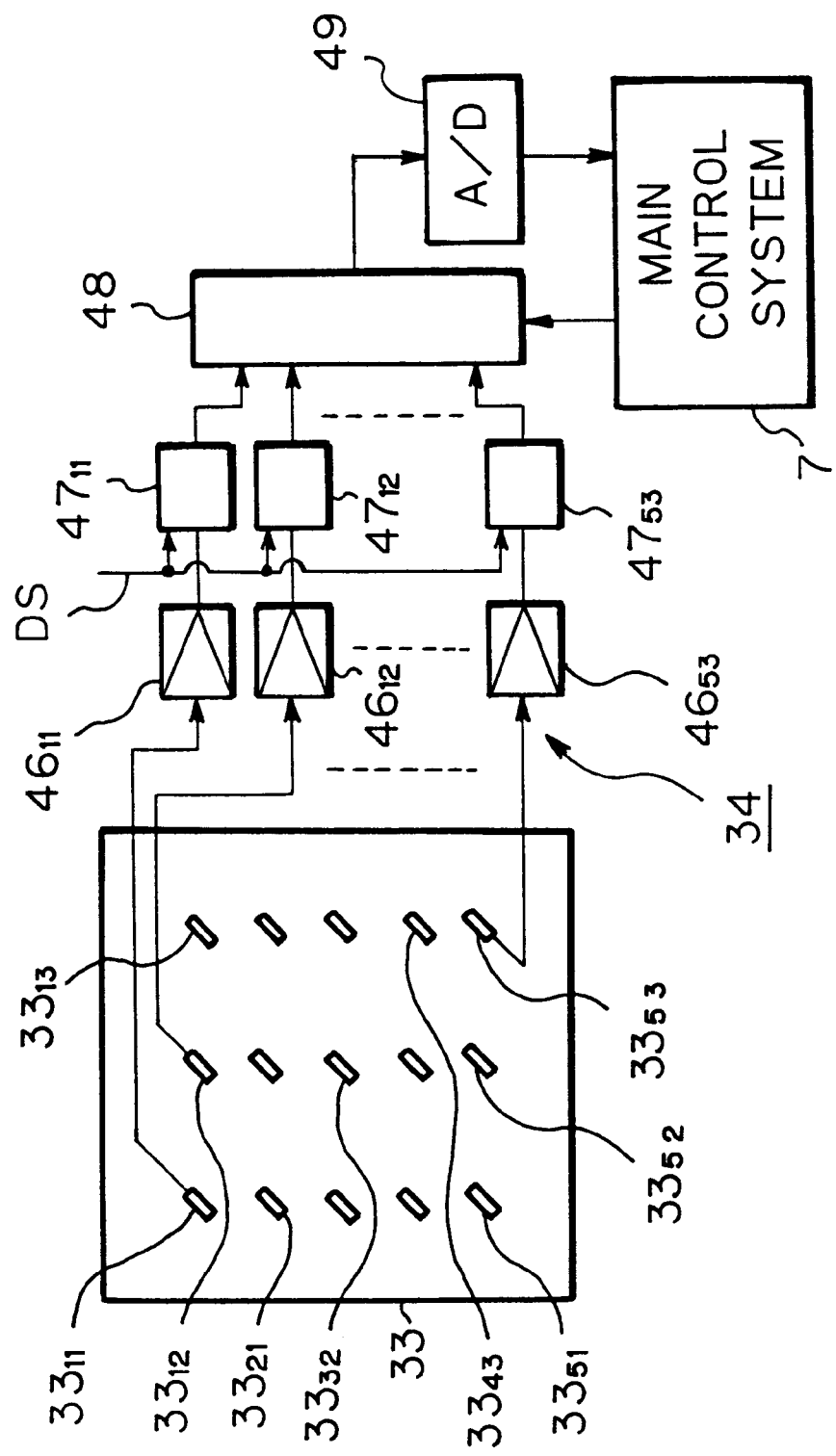

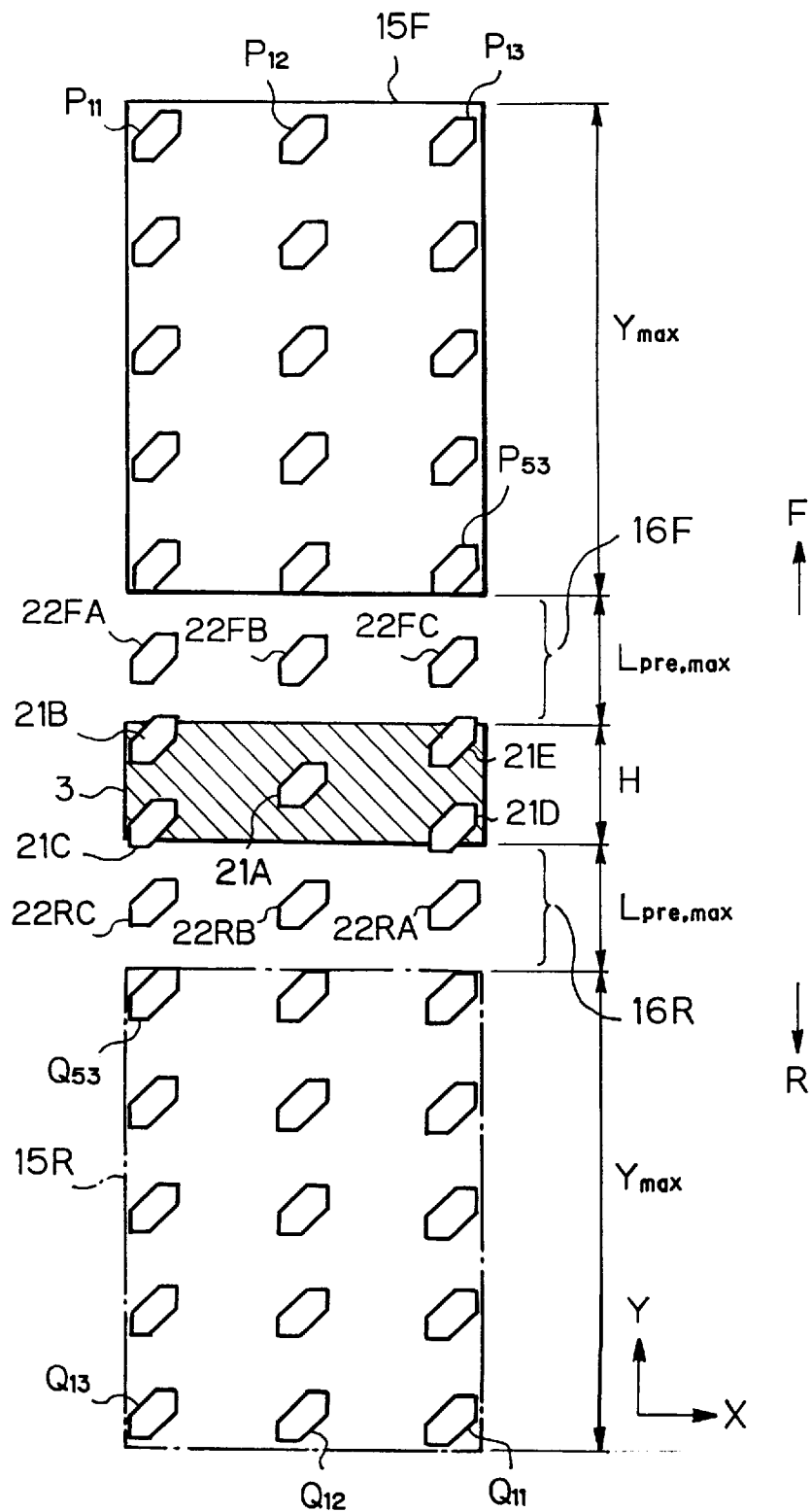

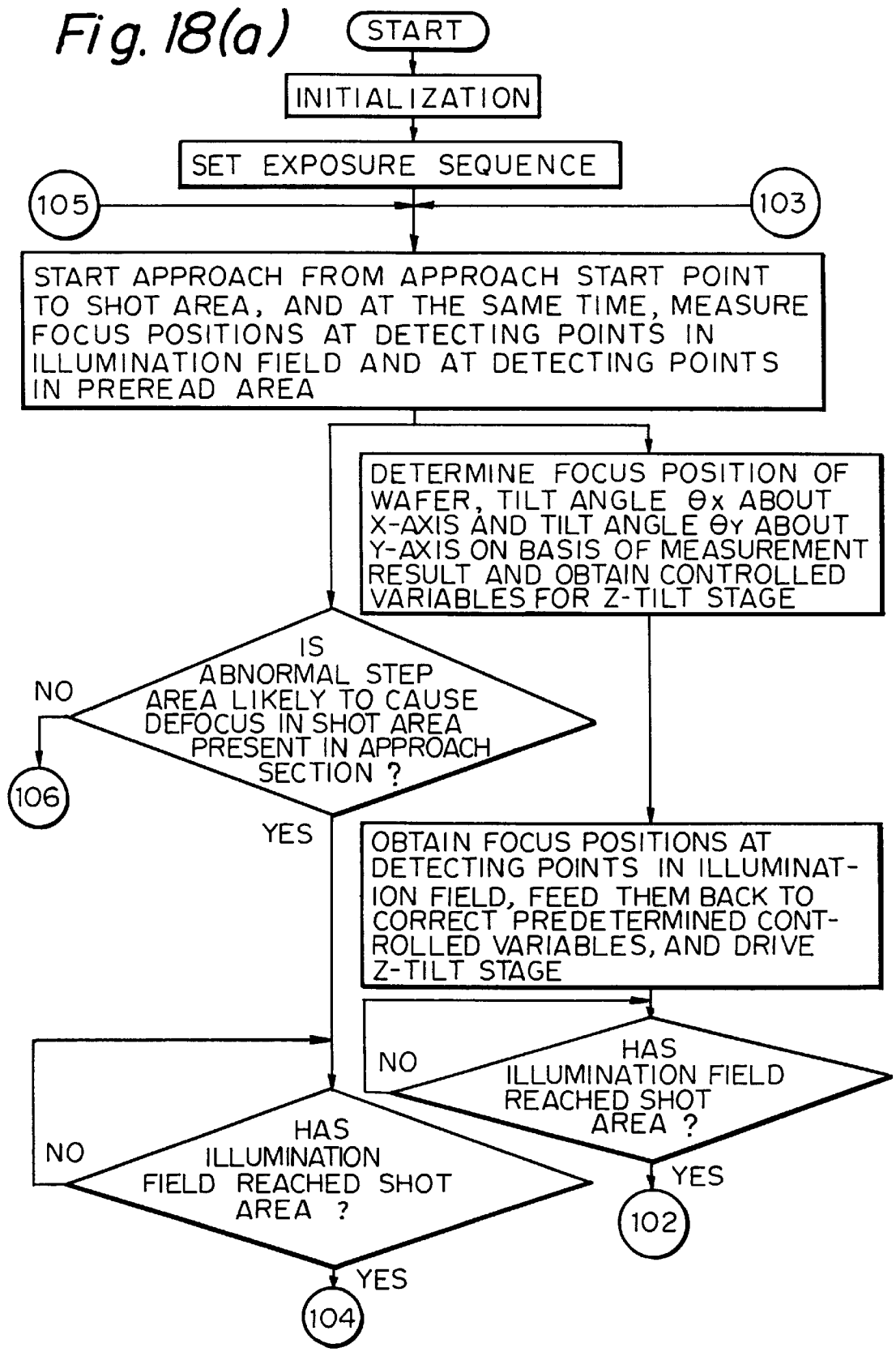

METHOD FOR SCANNING EXPOSURE

BACKGROUND OF THE INVENTION

1. Field of the Invention

The present invention relates to an exposure method and apparatus used for transferring a mask pattern onto a substrate in lithography processes to produce, for example, semiconductor devices, image-pickup devices (e.g., CCDs), liquid-crystal display devices, or thin-film magnetic heads. More particularly, the present invention relates to step-and-scan or other scanning exposure methods and apparatuses, in which a mask and a substrate are scanned synchronously relative to a projection optical system, thereby sequentially transferring a mask pattern onto the substrate.

2. Description of the Related Art

In production of semiconductor devices and so forth, one-shot exposure type projection exposure apparatuses, i.e., steppers, have heretofore been used, and step-and-scan type projection exposure apparatuses are also used these days, in which a reticle as a mask and a resist-coated wafer are synchronously moved relative to a projection optical system, thereby enabling exposure to be carried out for a shot area wider than the effective field of the projection optical system. In general, projection exposure apparatuses use a projection optical system which has a large numerical aperture (N.A.) and a shallow depth of focus. Therefore, it is necessary in order to transfer fine circuit patterns at high resolution to effect focusing such that the surface of the wafer coincides with the image plane of the projection optical system by an autofocus system.

Scanning exposure type projection exposure apparatuses such as the step-and-scan type similarly need to bring the surface of the wafer into focus at the image plane. However, in the scanning exposure type, the surface of the wafer is continuously scanned relative to a projection area (hereinafter referred to as "illumination field") where a part of the reticle pattern image is projected. Therefore, according to a known method, the focus position of the wafer surface (i.e., the position in the optical axis direction of the projection optical system) is detected only at predetermined detecting points in the illumination field. There has also been proposed a method in which the focus position is preread at detecting points preceding the illumination field, and the wafer surface in the illumination field is brought into focus to the image plane on the basis of information concerning the preread focus position and the focus position detected in the illumination field.

FIG. 19 illustrates exposure which is carried out to a wafer by a conventional step-and-scan type projection exposure apparatus. In FIG. 19, at the time of starting exposure, a slit-shaped illumination field 112, which is a projection area where a part of the reticle pattern image is projected, is at an approach start position preceding a shot area 111 on the wafer which is to be exposed. At this stage, the illumination field 112 is not illuminated by exposure light. Thereafter, the illumination field 112 starts to approach along a path shown by the arrow 113, and the shot area 111 is relatively scanned by the illumination field 112, thereby transferring the reticle pattern image onto the shot area 111. In actual practice, the wafer is moved through a wafer stage relative to the fixed illumination field 112. In FIG. 19, however, a system is illustrated such that the illumination field 112 moves relative to the wafer for the sake of explanation. Exposure light is applied after the illumination field 112 has reached the shot area 111.

In a system in which prereading is carried out during the scanning exposure, the focus position is continuously measured at detecting points 114A to 114E in the illumination field 112 by using a predetermined autofocus sensor. In addition, the focus position is continuously measured at detecting points 115A to 115C in a preread area preceding the illumination field 112 in the scanning direction. On the basis of the results of measurement of the focus position, an autofocus operation is executed by a servo system to effect focusing such that the surface of the wafer in the illumination field 112 coincides with the image plane, in the form of an operation including predictive control which is continuously executed from the approach start position.

When the shot area 111 is near the edge of the wafer, for example, focus position detecting points may be located outside the wafer when the illumination field 112 is at the approach start position. There are also cases where focus position detecting points lie in an area near the edge of the wafer where unevenness (undulation) is remarkable. In such cases, the focus position detecting points are moved to a flat area on the wafer, for example, by driving the wafer stage, and the wafer surface position is locked on the basis of the focus position measured at the flat area. In this state, approach of the illumination field 112 is executed.

In the conventional scanning exposure type projection exposure apparatus, at the time of starting exposure, the illumination field is not in a shot area which is to be exposed but lies at an approach start position preceding the shot area. Accordingly, in the system in which autofocusing is effected by measuring the focus position only at the detecting points in the illumination field, follow-up control for the focusing operation cannot satisfactorily be effected when there is a step in the shot area, for example. Therefore, a resolution failure or other problem may occur.

In the system in which an autofocusing operation is executed by effecting predictive control using prereading, if there is a steep change in unevenness on the surface in a shot area to be exposed, follow-up control may be impossible to effect on account of the mechanical response speed of the servo system, for example. In particular, when exposure is carried out for a partly-cut shot area near the edge of the wafer by scanning the illumination field relative to the wafer from the outside thereof, it is difficult to effect accurate follow-up control because of the steep change in unevenness on the wafer surface near the edge, and it is likely that exposure may be undesirably executed in a defocused state.

To avoid these problems, it may be considered to measure a distribution of focus positions in a shot area to be exposed in advance of scanning exposure. However, the detectable range of conventional autofocus sensors is limited within the illumination field or within an area with a predetermined width in the scanning direction beyond the illumination field. Therefore, to measure a distribution of focus positions in the shot area, the position of the wafer stage must be moved from the approach start point to a position where it is possible to measure the focus position in the shot area. Accordingly, it is necessary to repeat a series of operations, i.e., premeasurement of the focus position, start of approach, and scanning exposure, by moving the wafer stage for each shot area, and thus the throughput (productivity) of the exposure process is unfavorably reduced.

FIGS. 20(a) and 20(b) illustrate exposure conventionally carried out onto a wafer by using a step-and-scan type exposure apparatus similar to that used in FIG. 19, showing a case where an abnormal step is present in an approach section. Problems arising when there is an abnormal step in an approach section will be described below in detail with reference to these figures.

Referring to FIG. 20(a), when scanning exposure is started, an illumination field 121 is gradually accelerated (in actuality, the wafer is accelerated in the reverse direction) in an approach section (acceleration section) 122 leading to a shot area 120 as in the case of the process described in connection with FIG. 19. At this time, an autofocusing operation is continuously executed by a servo system to bring the surface of a wafer in the illumination field 121 into focus to the image plane on the basis of results of focus position detection carried out at detecting points in the illumination field 121 and at detecting points preceding the illumination field 121 in the scanning direction. Application of exposure light is started after synchronization of the wafer and an associated reticle has been completed in the approach section 122 and the illumination field 121 has reached the shot area 120, and the illumination field 121 is scanned relative to the wafer in an exposure section 123 along a path 126 shown by the arrow, thereby sequentially transferring a reticle pattern image onto the shot area 120. Thereafter, the application of exposure light is suspended, and the illumination field 121 is gradually decelerated in a deceleration section 124. In this case, if the scanning direction is reversed on the reticle side every time the exposure process shifts to the subsequent shot area, a useless movement is eliminated, and the throughput (productivity) can be improved. Therefore, it is common practice to reverse the scanning direction also on the wafer side in accordance with the reversion of the scanning direction on the reticle side every time the exposure process shifts to the subsequent shot area.

Thus, in the conventional step-and-scan type projection exposure apparatus, the focus position detection and the wafer surface position control based on the result of the detection are continuously carried out from the approach section 122 so that the wafer surface in the illumination field 121 can be accurately brought into focus to the image plane in the exposure section 123. However, if there is an abnormal step area 125W in the approach section 122 which is markedly different in the focus position from the surrounding area, as shown in FIG. 20(a). As a result of a foreign matter 125 present at the bottom of the wafer W as shown in FIG. 20(b), when the illumination field 121 passes over the abnormal step area 125W, the height of the wafer stage lowers a considerable amount in order to bring the wafer surface at this portion into focus at the image plane. Accordingly, when the illumination field 121 enters the shot area 120 after passing over the abnormal step area 125W, follow-up control for the wafer surface position cannot satisfactorily be effected. Consequently, exposure is started in a state where there is defocus between the wafer surface and the image plane. Therefore, a resolution failure or other problem may occur.

SUMMARY OF THE INVENTION

A first object of the present invention is to provide a scanning exposure method whereby when exposure is carried out to a wafer while executing a focusing operation, the wafer surface in an area which is to be exposed can be accurately brought into focus at the image plane without reducing the throughput even when there is a steep change in unevenness on the wafer surface in the area to be exposed.

A second object of the present invention is to provide a scanning exposure apparatus capable of effectively carrying out the scanning exposure method to attain the first object of the present invention.

A third object of the present invention is to provide a scanning exposure method in which when scanning exposure is carried out for a predetermined area on a wafer while executing an operation (focusing operation) to bring the wafer surface into focus to the image plane of a projection optical system, for example, defocus is unlikely to occur in the predetermined area even if an area which is markedly different in focus position from the surrounding area is present in an approach section of the wafer.

A fourth object of the present invention is to provide a scanning exposure apparatus capable of effectively carrying out the scanning exposure method to attain the third object of the present invention.

A fifth object of the present invention is provide a scanning exposure method whereby when exposure is carried out to a predetermined area on a substrate, a surface of the area on the substrate can be brought into focus to an image plane with an accurate position between them.

To attain the object, the present invention provides a scanning exposure method in which a substrate is exposed with an image through a projection optical system (PL) while moving the substrate (W). At an accelerating start position of the substrate, positions in the optical axis direction of the projection optical system are measured at a plurality of points ($P_{11}$ to $P_{53}$) on a surface of the substrate to be exposed, and during scanning exposure to the substrate, the surface position of the substrate is set on the basis of the measured positions in the optical axis direction.

According to the present invention, a distribution of positions (focus positions) of an area of the surface of the substrate to be exposed in the optical axis direction is measured, and surface configuration information, e.g., an average focus position and tilt angles, in each portion of the area to be exposed is obtained from the result of the measurement. Accordingly, it is possible to determine, in advance of the start of scanning exposure, how the substrate surface position should be controlled in accordance with the position of the substrate during a movement of the substrate to bring the surface of the area to be exposed into focus to the image plane. Therefore, even if there is a steep change in unevenness on the surface of the area to be exposed, the surface can be accurately brought into focus to the image plane at high follow-up speed. It should be noted that the operation of bringing the surface of the area to be exposed into focus to the image plane may be an autofocusing operation in a narrow sense whereby the surface of the area to be exposed is made coincident with the image plane on the basis of only an average focus position in each portion of the surface of the area. Further, the focusing operation may include an autoleveling operation whereby the surface of the area to be exposed is made coincident with the image plane on the basis of not only an average focus position but also tilt angles in each portion of the surface of the area.

In this case, it is desirable to remeasure the position of the substrate surface in the optical axis direction of the projection optical system after the substrate has been started to approach, and to set the surface position of the substrate on the basis of the remeasured position in the optical axis direction. In such a case, assuming that an area on the substrate where an image of a part of a mask pattern is projected is a slit-shaped exposure area (illumination field), focus positions are measured at predetermined detecting points, for example, in the slit-shaped exposure area or a preread area which precedes the exposure area in the scanning direction, and premeasured surface configuration information is corrected on the basis of the result of measurement of the actual focus position. Accordingly, even a piece of information concerning slight unevenness on the substrate surface is reflected, and therefore, focusing can be effected even more accurately. It is also possible to detect focus positions in an approach section extending from an approach start point to an area to be exposed and to correct the controlled variables. By doing so, focusing can be effected even more smoothly.

The arrangement may be such that the positions in the optical axis direction of the projection optical system are measured at a plurality of points on the surface of a shot area among a plurality of shot areas (SA1 to SAN) on the substrate at the approach start position of the substrate. Focusing can be effected accurately over substantially the whole surface of the shot area on the basis of the result of the measurement.

In this case, it is desirable to change the distribution of detecting points for measuring the positions in the optical axis direction at the approach start position of the substrate according to the configuration of a shot area to be exposed subsequently. In a case where the shot area concerned is near the edge of the substrate, for example, and focus position detecting points are also set outside the substrate, even a partly-cut shot area can be accurately brought into focus at the image plane by ignoring information concerning the focus positions at the detecting points outside the substrate.

To attain the object, the present invention provides a scanning exposure apparatus in which a substrate is exposed with an image through a projection optical system while moving the substrate. The apparatus includes a measuring system (14F, 14R) which measures, at an accelerating start position of a substrate, the positions in the direction of an optical axis of the projection optical system at a plurality of points on the surface of a shot area among a plurality of shot areas on the substrate which is to be exposed subsequently; a stage (10) which has the substrate mounted thereon and sets the surface position of the substrate; and a control system (7) which controls the stage on the basis of the positions in the optical axis direction measured by the measuring system during scanning exposure to the substrate. The above-described scanning exposure method can be effectively carried out by the scanning exposure apparatus according to the present invention.

In this case, a measuring area (15F, 15R) for measurement by the measuring system is determined, for example, on the basis of the acceleration of the substrate during approach and the speed of the substrate during scanning exposure. For example, as shown in FIG. 5, the measuring area (15F, 15R) is assumed to be set forward of the slit-shaped exposure area (3) in the scanning direction. Assuming that the maximum scanning speed of the substrate stage for moving the substrate is $V_{Wmax}$ and the acceleration is a, the maximum value $L_{pre,max}$ of the distance traveled by the substrate during approach is expressed by $V_{Wmax}^2/2a$, and the distance from the exposure area (3) to the measuring area (15F, 15R) should be on the order of $L_{pre,max}$. Assuming that the travel stroke of the substrate during scanning exposure is $L_{WST}$ and the width of the slit-shaped exposure area in the scanning direction is H and that the length of the deceleration section is approximately the same as the length of the approach section, the length $L_{EF}$ in the scanning direction of the maximum exposure field for which exposure can be effected by the scanning exposure apparatus is given by $$L_{EF}=L_{WST}-2 \cdot L_{pre,max}H$$

Therefore, to measure a distribution of focus positions over the whole surface of a shot area to be exposed subsequently at the approach start point, the length of the measuring area (15F, 15R) in the scanning direction should be set not less than the length $L_{EF}$ of the maximum exposure field.

To attain the object, according to a first aspect of the present invention, there is provided a scanning exposure method in which a substrate is exposed with an image through a projection optical system while moving the substrate. During an approach operation of the substrate in a predetermined direction, the position of the substrate surface in the optical axis direction of the projection optical system is measured, and it is judged whether or not the result of the measurement is within predetermined tolerance limits. When the result of the measurement is outside the tolerance limits, the substrate is subjected to scanning exposure while moving the substrate in a direction opposite to the predetermined direction.

In the present invention, the term "approach operation" is used to mean an operation which begins with the start of accelerating of the substrate and terminates with the start of application of exposure light (start of exposure) upon the scanning speed of the substrate reaching a target speed. In a case where the exposure is carried out in a manner such that the substrate and a mask having a pattern whose image is to be transferred onto the substrate are moved synchronously, and while doing so, the image of the pattern of the mask is transferred onto the substrate by exposure through the projection optical system, the term "approach operation" is used to mean an operation which begins with the start of accelerating of the mask and the substrate and terminates with the start of application of exposure light (start of exposure) upon the scanning speed of the mask and the substrate reaching a target speed and the completion of synchronization. As an example, the surface of the substrate is brought into focus to the image plane of the projection optical system by an autofocusing method on the basis of the positions (focus positions) in the optical axis direction of the projection optical system measured during the approach operation and the exposure. The focusing process may include an autoleveling operation in which the tilt angles of the substrate are also controlled. In such a case, if an abnormal step area where the focus position changes in excess of predetermined tolerance limits is detected during the approach operation, defocus may occur during exposure, depending upon the response speed of the focusing operation. Therefore, if an abnormal step area which is likely to interfere with focusing during exposure is detected, the exposure light illumination area is passed over the shot area to be exposed as far as the approach start point on the other side without application of exposure light. Then, the approach is restarted in a direction opposite to the predetermined direction to carry out scanning exposure. Because there is an extremely low probability of abnormal step areas being present on both sides of an area to be exposed, it becomes unlikely that defocus will occur during exposure by carrying out scanning exposure from the opposite direction.

In the scanning exposure method according to the first aspect of the present invention, it is desirable that during the approach operation of the substrate, the position of the substrate in the optical axis direction should be measured in at least one of the exposure light illumination area and a predetermined area (preread area) adjacent to the illumination area in the movement direction of the substrate, and the surface position of the substrate should be set on the basis of the result of the measurement.

To attain the object, according to a second aspect of the present invention, there is provided a scanning exposure method in which, as shown for example in FIG. 16, each of a plurality of shot areas (SA10 to SAN) on a substrate (W) is exposed while moving the substrate. The direction of movement of the substrate for exposing one shot area (SA24) on the substrate is decided according to the surface configuration of another shot area (SA21) adjacent to the one shot area in the direction (Y direction) of movement of the substrate, and the image is transferred onto the one shot area (SA24) by exposure while moving the substrate in the decided direction of movement.

In the scanning exposure method according to the second aspect of the present invention, the surface of the substrate is brought into focus to the image plane of a mask pattern, for example, on the basis of the height (focus position) of the substrate measured during the approach operation of the substrate and the exposure carried out thereto, for example, as in the case of the scanning exposure method according to the first aspect of the present invention. If an abnormal step area is detected during the approach operation, defocus may occur during exposure. In general, an approach section for a certain shot area (SA24) lies in a shot area (SA21) adjacent to the shot area (SA24) in the scanning direction. Therefore, it is possible to prejudge whether or not there is an abnormal step area in the approach section for the shot area (SA24) by detecting the surface configuration of the shot area (SA21) during the scanning exposure therefor. If such an abnormal step area is present, the scanning direction is reversed in advance, and the shot area (SA24) is exposed by carrying out scanning from the opposite side. Thus, the throughput improves, and defocus is unlikely to occur during exposure.

That is, in the scanning exposure method according to the second aspect of the present invention, it is desirable that before one shot area (SA24) is exposed, a shot area (SA21) adjacent thereto should be exposed to the mask pattern image while detecting the surface configuration of the adjacent shot area (SA21), and the direction of movement of the substrate for exposing the one shot are a (SA24) should be decided according to the surface configuration of the adjacent shot area (SA21) detected during the scanning exposure for the adjacent shot area.

The arrangement may be such that the direction of movement of the substrate for exposing a shot area (SA25) to be exposed subsequently to the one shot area (SA24) is reversed with respect to the direction of movement of the substrate for exposing the one shot area. In general, it is possible to avoid a useless movement and hence improve the throughput by reversing the scanning direction on the mask side every time the exposure process shifts to the subsequent shot area. Therefore, the throughput can be improved by reversing the scanning direction on the substrate side in accordance with the reversion of the scanning direction on the mask side every time the exposure process shifts to the subsequent shot area.

The arrangement may be such that the direction of movement of the substrate for exposing a shot area (SA25) to be exposed subsequently to the one shot area (SA24) is set to the same direction as the direction of movement of the substrate in exposure carried out for a preceding photosensitive layer on the substrate at the shot area (SA25) to be exposed subsequently. During scanning exposure there is a possibility that the amount of displacement will subtly vary according to the scanning direction. Therefore, the overlay accuracy may be improved by setting the scanning direction to the same direction as in the preceding layer.

To attain the object, the present invention provides a scanning exposure apparatus in which a substrate is exposed with an image of a pattern formed on a mask through a projection optical system while the substrate and the mask are moved synchronously. The apparatus includes a measuring system which measures the position of the surface of the substrate in the optical axis direction of the projection optical system during an approach operation of the substrate in a predetermined direction; a stage which has a substrate mounted thereon to be moved therewith; a judging system which judges whether or not the result of measurement by the measuring system is within predetermined tolerance limits; and a control system which controls the stage such that when the result of the measurement is outside the tolerance limits, the substrate is exposed while moving it in a direction opposite to the predetermined direction. The above-described scanning exposure method can be effectively carried out by the scanning exposure apparatus according to the present invention.

BRIEF DESCRIPTION OF THE DRAWINGS

The above and other objects, features and advantages of the present invention will be apparent from the following detailed description of the preferred embodiments thereof, reference being made to the accompanying drawings, in which:

FIG. 4 is a diagram showing a photoelectric detector and a signal processing system in FIG. 2;

FIG. 9 is a diagram showing the distribution of focus position detecting points in another embodiment of the present invention;

FIGS. 18(a), 18(b), 18(c) and 18(d) are flowcharts showing an example of the contents of control by a control system of the scanning exposure apparatus shown in FIG. 12;

DESCRIPTION OF THE PREFERRED EMBODIMENTS

One embodiment of the present invention will be described below with reference to FIGS. 1 to 8. In this embodiment, the present invention is applied to a process in which exposure is carried out by a step-and-scan type projection exposure apparatus.

Figure 1:
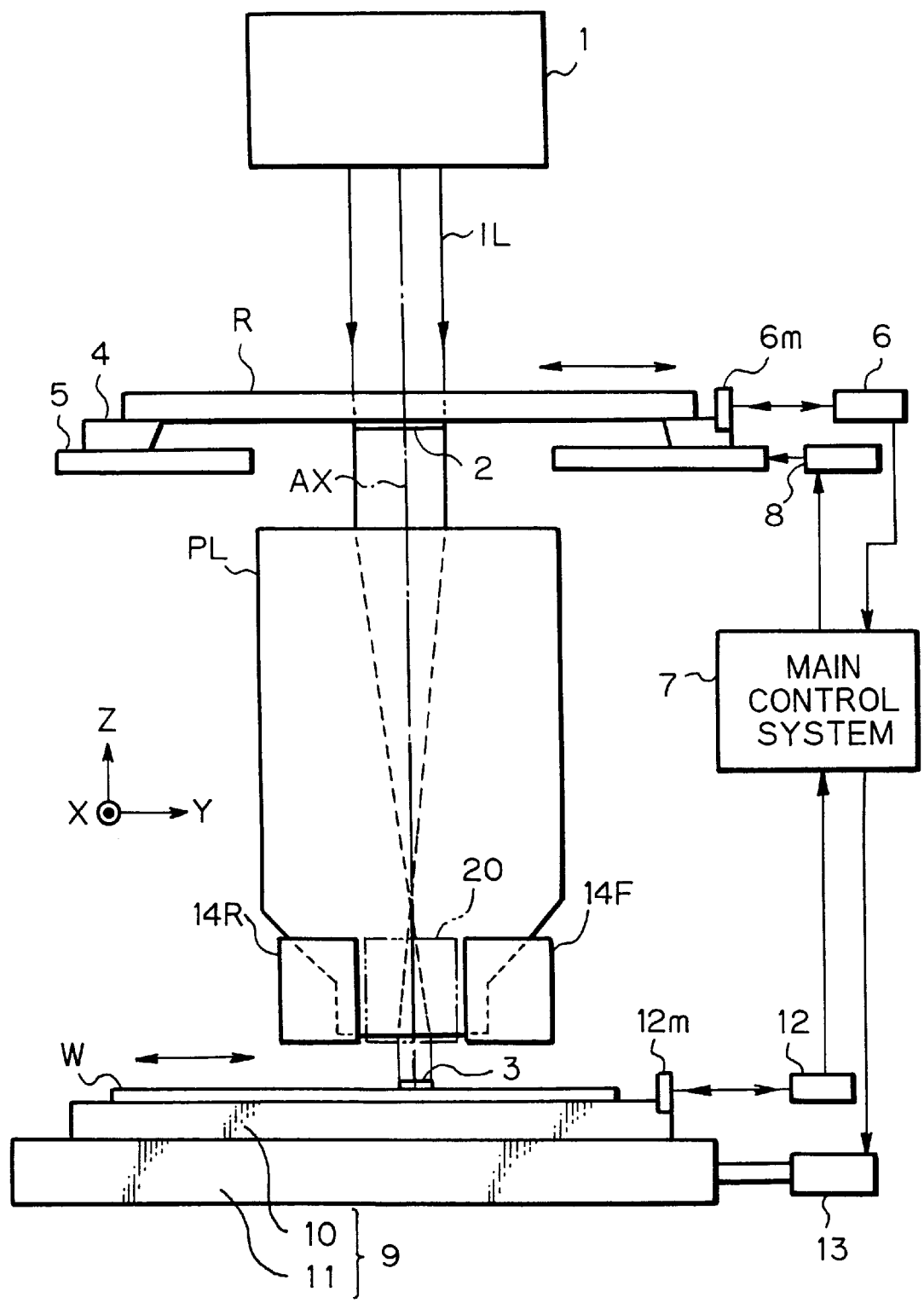
FIG. 1 is a schematic diagram showing the arrangement of a step-and-scan type projection exposure apparatus used in an embodiment of the present invention.

FIG. 1 shows a projection exposure apparatus in this embodiment. Referring to FIG. 1, an illumination optical system 1 includes a light source, a fly's-eye lens, a field stop, a condenser lens, etc. During exposure, a rectangular illumination area 2 on a pattern surface (lower surface) of a reticle R is illuminated by exposure light IL from the illumination optical system 1, e.g. the i-line from a mercury-vapor lamp, or excimer laser light. Under the application of exposure light IL, an image of a pattern on the reticle R in the illumination area 2 is projected onto a rectangular illumination field 3 on a resist-coated wafer W at a predetermined projection magnification $\beta$ ($\beta$ is ¼, ⅕, etc.) through a projection optical system PL. In the following description, a Z-axis is taken in a direction parallel to an optical axis AX of the projection optical system PL, and an X-axis is taken in a direction perpendicular to the plane of FIG. 1 in a plane perpendicular to the optical axis AX, and further a Y-axis is taken in a direction parallel to the plane of FIG. 1 in the plane perpendicular to the optical axis AX.

The reticle R is held on a reticle stage 4. The reticle stage 4 moves continuously in the Y direction (scanning direction) on a reticle base 5 and finely adjusts the position of the reticle R in the XY-plane. The two-dimensional position of the reticle stage 4 (reticle R) is measured by a combination of a moving mirror 6m on the reticle stage 4 and a laser interferometer 6 outside the reticle stage 4. The result of the measurement is supplied to a main control system 7 which effects overall control of operations of the apparatus. The main control system 7 controls the position and movement speed of the reticle stage 4 through a reticle stage driving system 8.

Figure 11A:
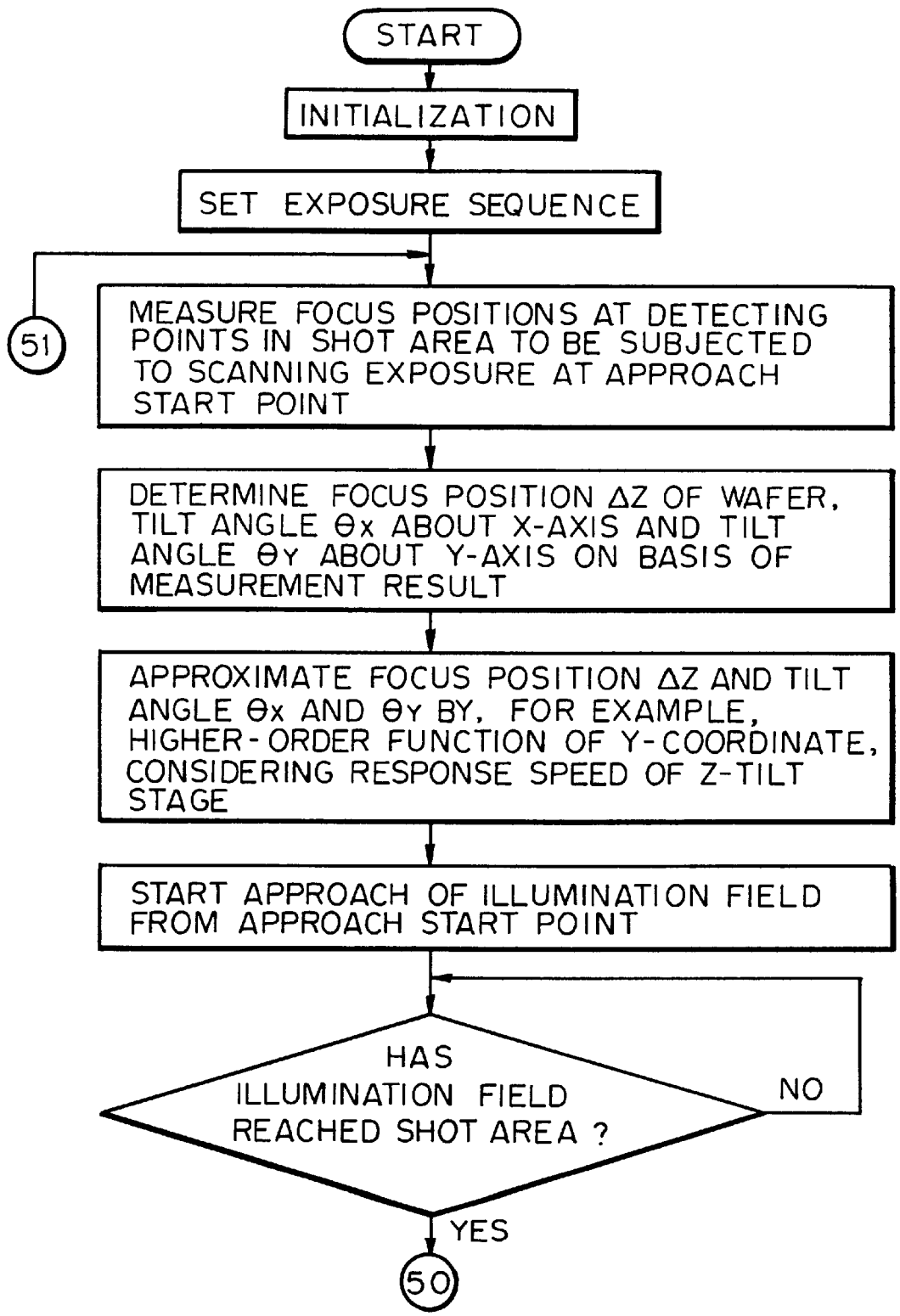
FIGS. 11(a) and 11(b) are flowcharts showing an example of the contents of control by a control system of the scanning exposure apparatus shown in FIG. 1.
Figure 11B:
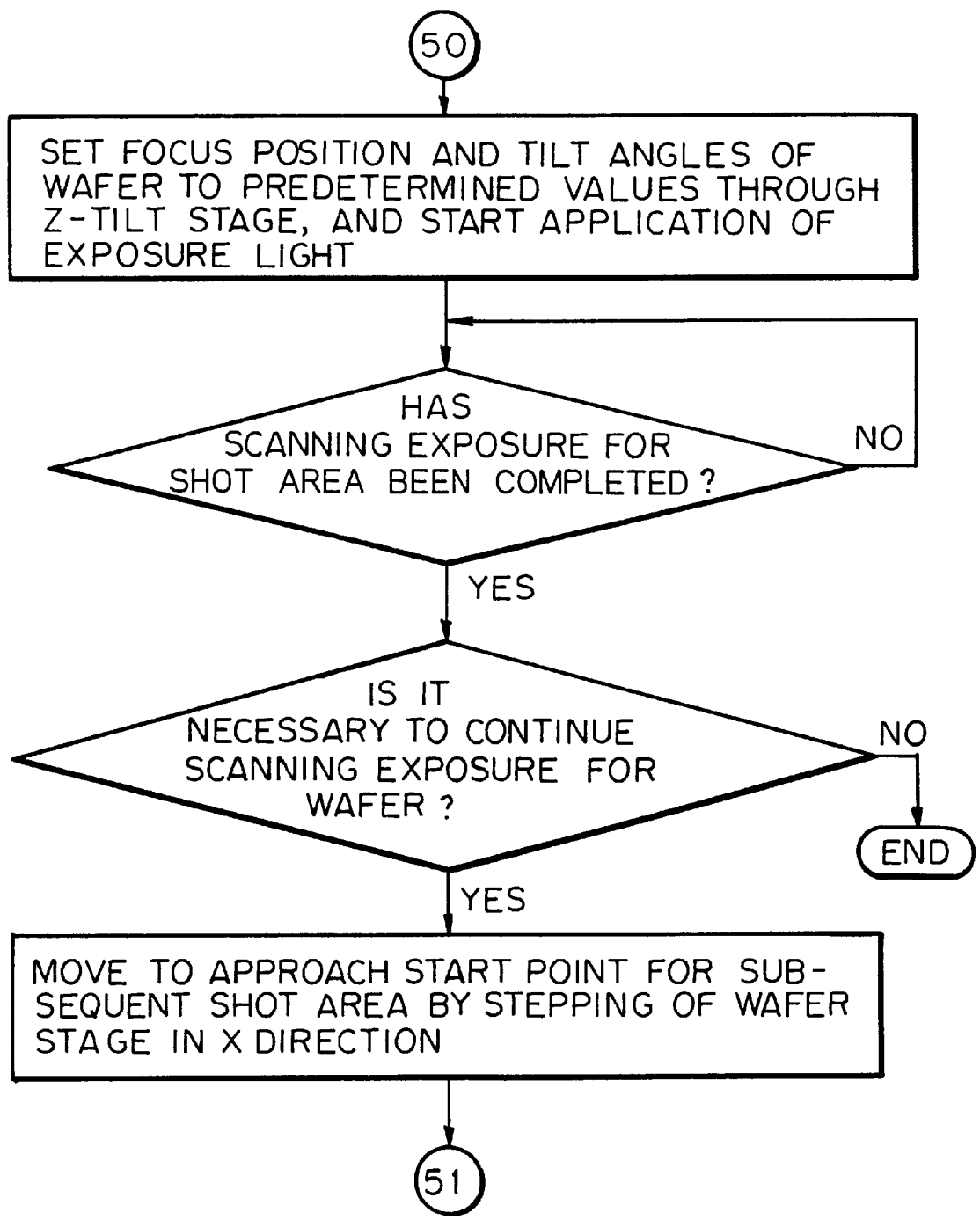

The wafer W is held by a vacuum on a wafer holder (not shown). The wafer holder is secured to a Z-tilt stage 10. The Z-tilt stage 10 is mounted on an XY-stage 11. The Z-tilt stage 10 and the XY-stage 11 constitute a wafer stage 9. The Z-tilt stage 10 controls the position (focus position) of the wafer W in the Z direction and also effects tilt angle control (leveling). The XY-stage 11 continuously moves the Z-tilt stage 10 (wafer W) in the Y direction and also effects stepping in the X direction and Y direction. The two-dimensional position of the Z-tilt stage 10 (wafer W) is constantly measured by a combination of a moving mirror 12m secured to the upper end of the Z-tilt stage 10 and a laser interferometer 12 outside the Z-tilt stage 10. The result of the measurement is supplied to the main control system 7. On the basis of the result of the measurement, the main control system 7 controls the scanning and positioning operation of the XY-stage 11 through a wafer stage driving system 13. During scanning exposure, when the reticle stage 4 and the wafer stage 9 are in synchronization with each other, the reticle R is scanned relative to the illumination area 2 in the +Y direction (or −Y direction) at speed $V_R$ through the reticle stage 4 using the projection magnification $\beta$, and the wafer W is scanned relative to the illumination field 3 in the −Y direction (or +Y direction) at speed VW (=$\beta \cdot V_R$) through the XY-stage 11 in synchronism with the scanning of the reticle R. The contents of control as shown for example in FIGS. 11(a) and 11(b) are stored in a memory part (not shown) of the main control system 7.

Next, autofocus sensors used in this embodiment will be described. A first multipoint autofocus sensor (hereinafter referred to as "multipoint AF sensor") 14F of the wide-area detection and oblique incidence type is installed on the +Y side of the lower portion of the projection optical system PL in this embodiment, and a second multipoint AF sensor 14R of the wide-area detection and oblique incidence type is installed on the −Y side of the lower portion of the projection optical system PL. The multipoint AF sensors 14F and 14R have the same arrangement; therefore, the arrangement of the multipoint AF sensor 14F will be described below.

Step-and scan type projection exposure apparatus described in this embodiment is shown in U.S. Pat. No. 5,448,322, U.S. application Ser. No. 08/647,325 (filed May 9, 1996), U.S. application Ser. No. 08/807,647 (filed Feb. 27, 1997), U.S. application Ser. No. 08/621,486 (filed Mar. 25, 1996), respectively. Descriptions in those patent and patent applications are incorporated herein and form a part thereof.

Figure 2:
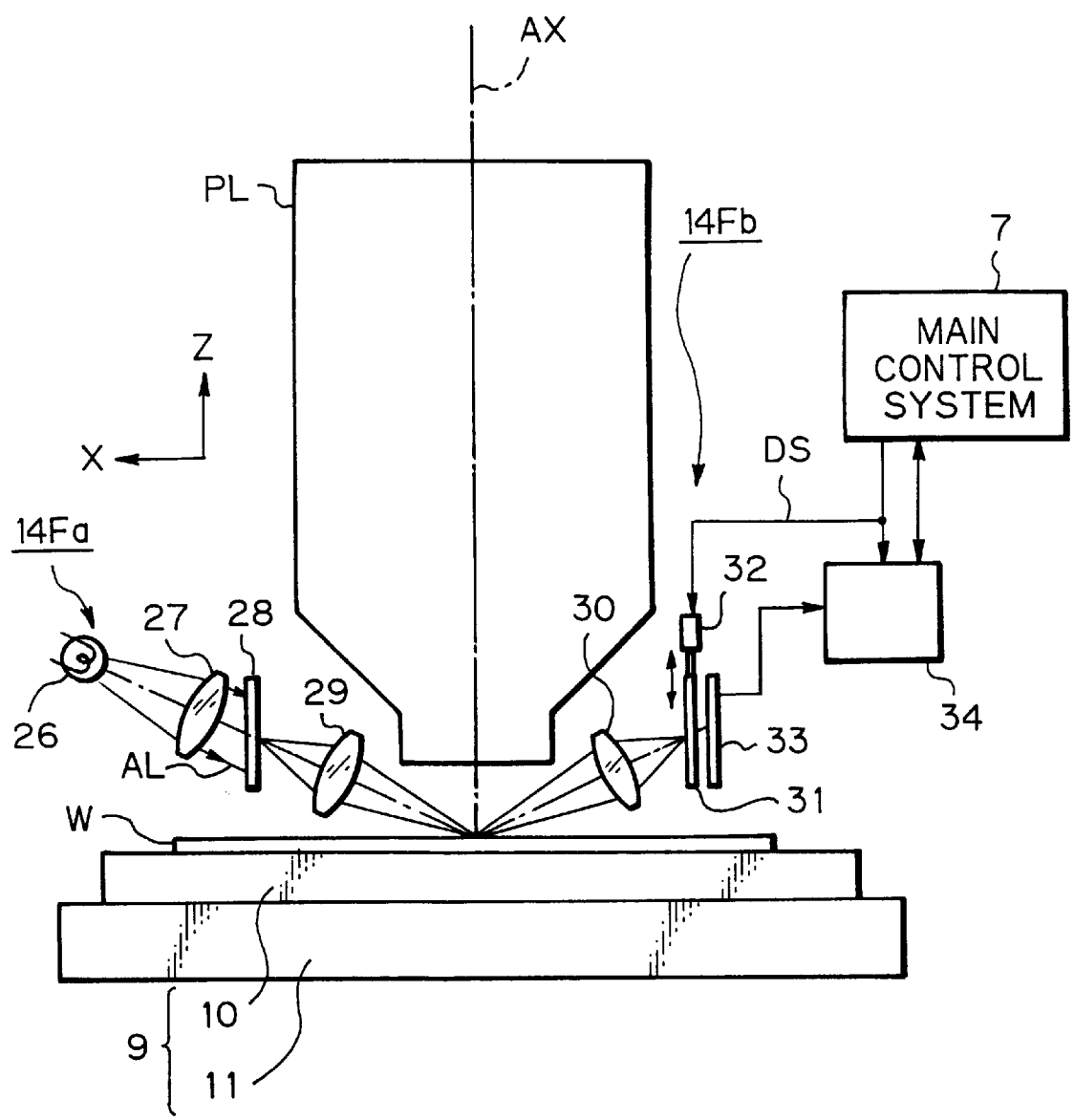
FIG. 2 is a side view of an essential part of the arrangement shown in FIG. 1 as seen from the +Y direction.

FIG. 2 is a side view of the projection exposure apparatus shown in FIG. 1 as seen from the +Y direction. Referring to FIG. 2, the multipoint AF sensor 14F comprises an illumination optical system 14Fa and a light-receiving optical system 14Fb. In the illumination optical system 14Fa, a light source 26 emits detecting light AL to which the photoresist used is not sensitive. The detecting light AL passes through a condenser lens 27 to illuminate a multiplicity of slits in a light-sending slit plate 28. Images of the slits are projected through an objective lens 29 onto detecting points $P_{11}$ to $P_{53}$ on the wafer W obliquely to the optical axis AX of the projection optical system PL. The detecting points $P_{11}$ to $P_{53}$ are arranged in a matrix with 5 rows and 3 columns in a first measuring area 15F (see FIG. 5) on the wafer W.

Figure 5:
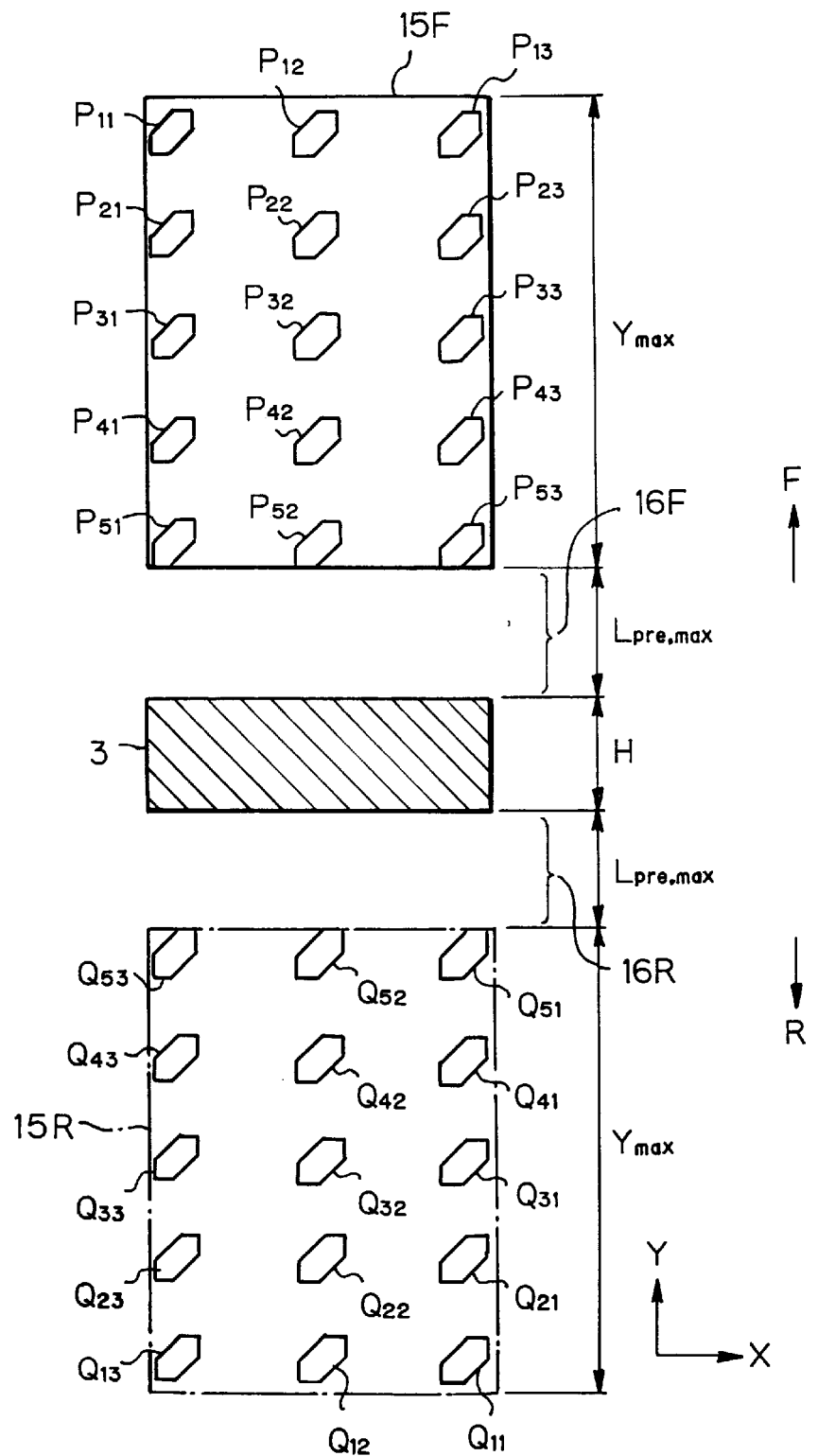
FIG. 5 is a diagram showing the distribution of focus position detecting points in the embodiment.

FIG. 5 shows the arrangement of the focus position detecting points $P_{11}$ to $P_{53}$ on the wafer W. In FIG. 5, the first measuring area 15F is set apart from the illumination field 3, which is in the shape of a rectangle elongated in the X direction, by a section 16F having a length $L_{pre,max}$ in the +Y direction (direction F). When the illumination field 3 is at an approach start point, the section 16F serves as an approach section. The width of the measuring area 15F in the X direction (non-scanning direction) is set equal to the width of the illumination field 3. The length $Y_{max}$ of the measuring area 15F in the Y direction (scanning direction) is set equal to the length of the largest exposure field, which is the largest exposure area (shot area) for which scanning exposure can be carried out by the projection exposure apparatus according to this embodiment. In the measuring area 15F, the detecting points $P_{11}$ to $P_{53}$ are set in a matrix with 5 rows in the Y direction and 3 columns in the X direction.

A second measuring area 15R is set apart from the illumination field 3 by a section 16R having a length $L_{pre,max}$ in the −Y direction (direction R). The second measuring area 15R has the same size as the measuring area 15F. In the measuring area 15R, detecting points $Q_{11}$ to $Q_{53}$ are set in a matrix with 5 rows in the Y direction and 3 columns in the X direction in symmetry with the detecting points $P_{11}$ to $P_{53}$. Slit images are projected onto the detecting points $Q_{11}$ to $Q_{53}$, respectively, by the second multipoint AF sensor 14R, which is shown in FIG. 1.

Referring to FIG. 2, reflected light from the detecting points $P_{11}$ to $P_{53}$ passes through a condenser lens 30 in the light-receiving optical system 14Fb and is condensed onto a vibrating slit plate 31. Thus, the slit images projected onto the detecting points are re-formed on the vibrating slit plate 31. The vibrating slit plate 31 is caused to vibrate in a predetermined direction by a vibrator 32 driven by a driving signal DS from the main control system 7. Light passing through a multiplicity of slits in the vibrating slit plate 31 is photoelectrically converted by a multiplicity of photoelectric converting elements, respectively, on a photoelectric detector 33, and the photoelectrically converted signals are supplied to a signal processing system 34.

Figure 3A:
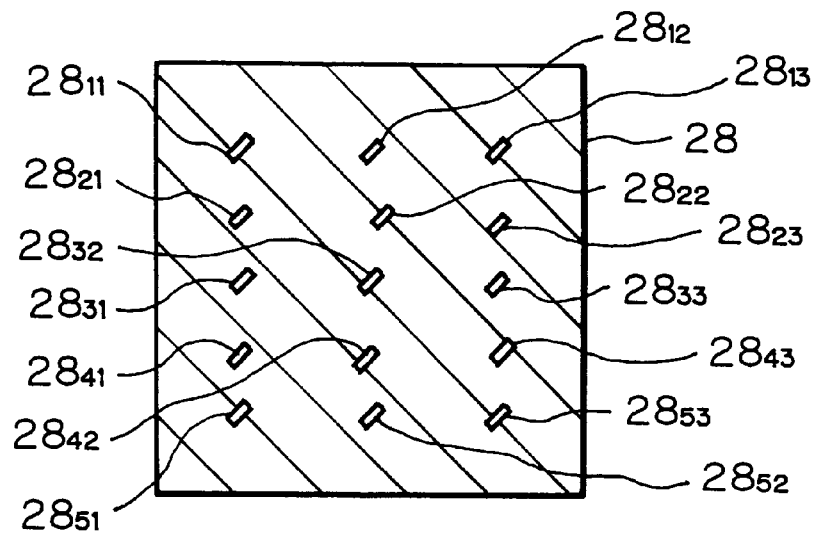
FIGS. 3(a) and 3(b) show a light-sending slit plate and a vibrating slit plate, respectively, in FIG. 2.
Figure 3B:
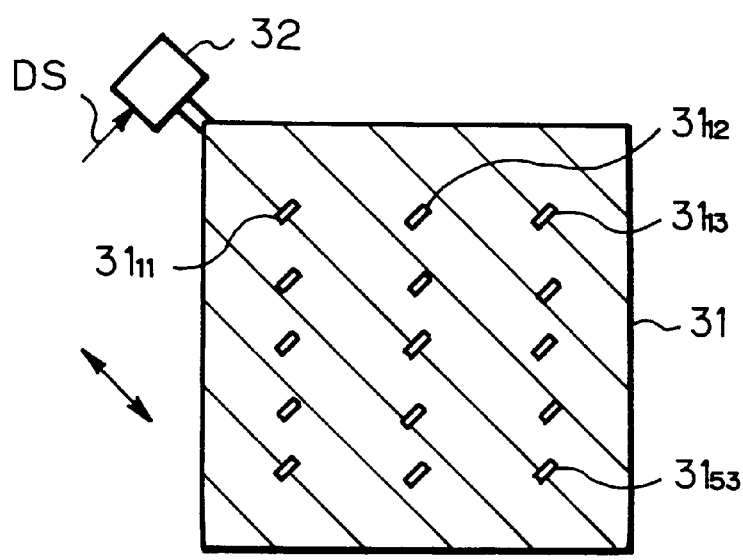

FIG. 3(a) shows the light-sending slit plate 28 in FIG. 2. Referring to FIG. 3(a), the light-sending slit plate 28 has slits 2811 to 2853 formed at respective positions corresponding to the detecting points $P_{11}$ to $P_{53}$ on the wafer W shown in FIG. 5. As shown in FIG. 3(b), the vibrating slit plate 31 shown in FIG. 2 also has slits 3111 to 3153 formed at respective positions corresponding to the detecting points P11 to P53 in FIG. 5. The vibrating slit plate 31 is caused to vibrate in a measuring direction perpendicular to the longitudinal direction of each slit by the vibrator 32.

FIG. 4 shows the photoelectric detector 33 and the signal processing system 34, which are shown in FIG. 2. Referring to FIG. 4, the photoelectric detector 33 has photoelectric converting elements $33_{11}$ to $33_{53}$. Light rays reflected from the detecting points $P_{11\,to\,P53}$ in FIG. 5 and passing through the corresponding slits in the vibrating slit plate 31 are incident on the photoelectric converting elements $33_{11}$ to $33_{53}$ on the photoelectric detector 33. Detected signals from the photoelectric converting elements $33_{11}$ to $33_{53}$ are supplied through amplifiers $46_{11}$ to $46_{53}$ to synchronous rectifiers $47_{11}$ to $47_{53}$, respectively. Each of the synchronous rectifiers $47_{11}$ to $47_{53}$ synchronously rectifies the detected signal inputted thereto by using the driving signal DS for the vibrator 32, thereby generating a focus signal changing approximately in proportion to the focus position at the corresponding detecting point within a predetermined range. In this embodiment, calibration is performed in advance so that the focus signals outputted from the synchronous rectifiers $47_{11}$ to $47_{53}$ are zero when the corresponding detecting points are coincident with a prolongation of the image plane (best focus position) of the projection optical system PL in FIG. 1.

The focus signals outputted from the synchronous rectifiers $47_{11}$ to $47_{53}$ are supplied to a multiplexer 48 in parallel. The multiplexer 48 supplies an analog-to-digital (A/D) converter 49 with focus signals selected in order from those supplied thereto synchronously with a switching signal from the main control system 7. Digital focus signals outputted from the A/D converter 49 are sequentially stored into a memory in the main control system 7. The main control system 7 can recognize from the focus signals the focus positions (to be precise, amounts of deviation from the best focus position) at the corresponding detecting points. Reflected light from the detecting points Q11 to Q53 in the second measuring area 15R in FIG. 5 is incident on the second multipoint AF sensor 14R in FIG. 1. The multipoint AF sensor 14R outputs focus signals corresponding to the focus positions at the detecting points $Q_{11}$ to $Q_{53}$. The focus signals are stored into the memory in the main control system 7.

In FIG. 5, when the illumination field 3 is scanned relative to the wafer in the +Y direction (in actuality, the wafer is scanned in the −Y direction), the main control system 7 obtains a surface configuration of a shot area to be exposed from information concerning the focus positions at the detecting points $P_{11}$ to $P_{53}$ in the measuring area 15F lying in the +Y direction, and drives the Z-tilt stage 10 during scanning exposure on the basis of the surface configuration, thereby bringing the wafer surface in the illumination field 3 into focus to the image plane of the projection optical system PL by the autofocusing method and the autoleveling method. When the illumination field 3 is scanned relative to the wafer in the −Y direction (in actuality, the wafer is scanned in the +Y direction), the main control system 7 uses information concerning the focus positions at the detecting points $Q_{11}$ to $Q_{53}$ in the measuring area 15R lying in the −Y direction. Thus, even when the scanning direction is reversed, focus positions can be measured at each approach start point of the wafer stage 9 as described later. Therefore, the throughput of the exposure process improves.

The arrangements and configurations of the focus position measuring areas 15F and 15R used by the multipoint AF sensors 14F and 14R, which are shown in FIG. 5, will be described below in detail. Referring to FIG. 5, the length $L_{pre,max}$ of each of the sections 16F and 16R is set equal to an approach distance traveled by the wafer W when the wafer stage 9 in FIG. 1 is moved in the Y direction at the maximum scanning speed $V_{wmax}$ and the scanning exposure is carried out. More specifically, in FIG. 1, the projection magnification β of the projection optical system PL is, for example, ¼ or ⅕, and the scanning speed of the reticle stage 4 is considerably higher than the scanning speed of the wafer stage 9. Therefore, the maximum scanning speed $V_{Wmax}$ of the wafer stage 9 may be determined according to the maximum scanning speed of the reticle stage 4 as an example. Assuming that the acceleration in the Y direction of the wafer stage 9 during scanning exposure is a, the length $L_{pre,max}$ may be approximately given by $$L_{pre,max} = V_{Wmax}^2 / (2a) \tag{1}$$

More specifically, assuming that the maximum scanning speed $V_{Wmax}$ is 100 mm/s and the acceleration a is 1000 mm/s², the length $L_{pre,max}$ of each of the sections 16F and 16R is determined to be 5 millimeters from Eq.(1). The reticle stage 4 is arranged to move rightward and leftward alternately every time the scanning direction is reversed. Therefore, assuming that the reticle stage 4 and the wafer stage 9 move in a speed ratio approximately equal to the projection magnification β also in the approach section, the stroke $L_{WST}$ in the Y direction of the wafer W during scanning exposure is substantially determined by the stroke in the Y-direction of the reticle stage 4. Therefore, assuming that, in FIG. 5, the width in the Y direction of the illumination field 3 is H, the length $L_{EF}$ in the Y direction of the maximum exposure field for which exposure can be effected by a scanning exposure method using the projection exposure apparatus according to this embodiment is given by $$L_{EF}=L_{WST}-2\cdot L_{pre,max}-H \qquad (2)$$

The width Ymax in the Y direction of each of the measuring areas 15F and 15R in this embodiment is set to be equal to the length $L_{EF}$ of the maximum exposure field. Thus, for any shot area, a distribution of focus positions can be measured by a single measuring operation executed in a stationary state. It may be explained by using the width $Y_{max}$ that, in FIG. 5, the measuring areas 15F and 15R for the multipoint AF sensors 14F and 14R in this embodiment are each set so as to cover an area extending from a point away from the center (the optical axis AX of the projection optical system PL) of the illumination field 3 in the scanning direction by a distance $(H/2+L_{pre,max})$ to a point away from the center of the illumination field 3 in the scanning direction by a distance $(H/2+L_{pre,max}+Y_{max})$.

An example of the scanning exposure operation of the projection exposure apparatus according to this embodiment, which has the wide-area detection type multipoint AF sensors 14F and 14R arranged as described above, will be described below with reference to FIGS. 6, 7, 8(a), 8(b), 11(a) and 11(b).

Figure 6:
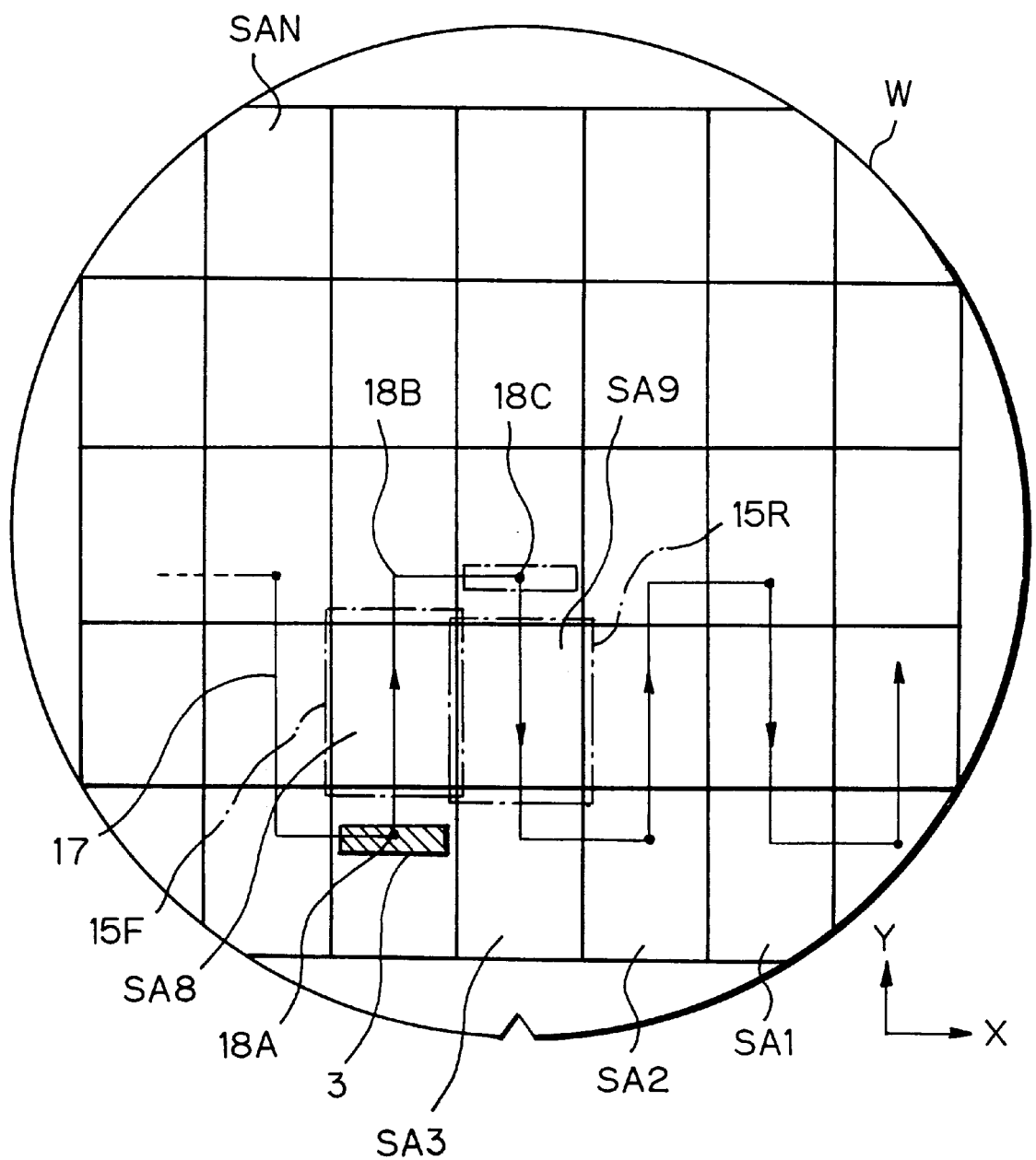
FIG. 6 is a plan view of a wafer for explanation of a scanning exposure operation of the embodiment.

FIG. 6 shows the wafer W to be exposed in this embodiment. Referring to FIG. 6, the wafer W has shot areas SA1, SA2, . . . , SAN (N is an integer of 2 or higher) formed on the surface thereof at a predetermined pitch in each of the X and Y directions. It is assumed that the size of each shot area SAi (i=1 to N) is approximately the same as that of the maximum exposure field. It is also assumed that a pattern image of the reticle R is transferred onto the shot areas SA1 to SAN by the scanning exposure method in order from the shot area SA1. In the following description, a scanning exposure operation will be explained with regard to a case where exposure is carried out for the shot area SA8 in the center of the wafer W by scanning the illumination field 3 relative to the shot area SA8 in the +Y direction along a path 17. In actuality, the wafer W is scanned relative to the fixed illumination field 3. In the following description, however, it is assumed that the illumination field 3 is scanned relative to the wafer W for the sake of explanation.

In this case, at the time of starting scanning exposure, the center of the illumination field 3 lies at an approach start point 18A. Assuming that the scanning speed of the wafer stage 9 during scanning exposure is $V_{Wmax}$, the distance of an approach section from the leading end of the illumination field 3 to the shot area SA8 has been set to a length $L_{pre,max}$ determined by Eq.(1). Accordingly, as will be clear from FIG. 5, the shot area SA8 is substantially covered by the measuring area 15F for the multipoint AF sensor 14F. In this state, the main control system 7 measures the focus positions at 15 detecting points P11 to P53 set in a matrix with 5 rows and 3 columns in the measuring area 15F, i.e., the shot area SA8, through the multipoint AF sensor 14F.

Figure 7:
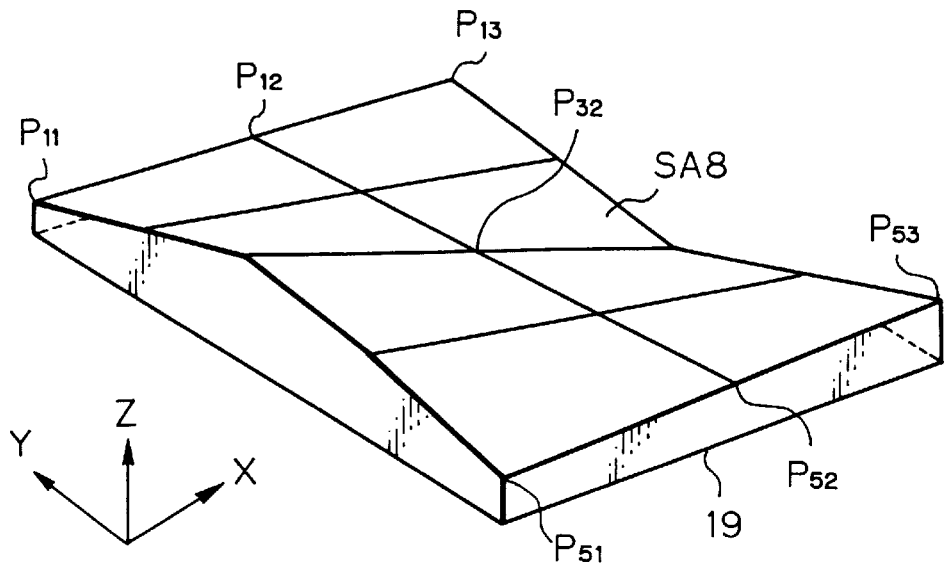
FIG. 7 is a diagram showing an example of the distribution of focus positions measured in one shot area shown in FIG. 6.

FIG. 7 shows an example of a distribution of focus positions (surface configuration) measured at that time. In FIG. 7, the focus positions at the detecting points P11 to P53 on the surface of the shot area SA8 are expressed as the amounts of deviation from the image plane 19. The surface of the shot area SA8 has great unevenness. On the basis of the result of the measurement, the main control system 7 determines a focus position $\Delta Z$ of the wafer W, together with a tilt angle $\theta_X$ about the X-axis of the wafer W (i.e. pitching in the scanning direction) and a tilt angle $\theta_Y$ about the Y-axis of the wafer W (i.e. rolling relative to the scanning direction), to bring the surface of the wafer W in the illumination field 3 into focus at the image plane of the projection optical system PL in correspondence to the Y-coordinate of the wafer W during scanning exposure.

In this case, the focus position $\Delta Z$ and the tilt angles $\theta_X$ and $\theta_Y$ are approximated, for example, by a quadratic function of the Y-coordinate so that the surface of the wafer W is continuously and smoothly brought into focus to the image plane by taking into consideration the response speed of the Z-tilt stage 10 in FIG. 1 as well. Coefficients of the function may be determined by the method of least squares. It is also possible to use a method of computation, such as the Max-Min method, whereby the maximum deviation is minimized. The latter method is effective at minimizing an error (control error) of the focus position at a step portion as present when there is a foreign matter on the obverse or reverse surface of the wafer W.

Figure 8A:
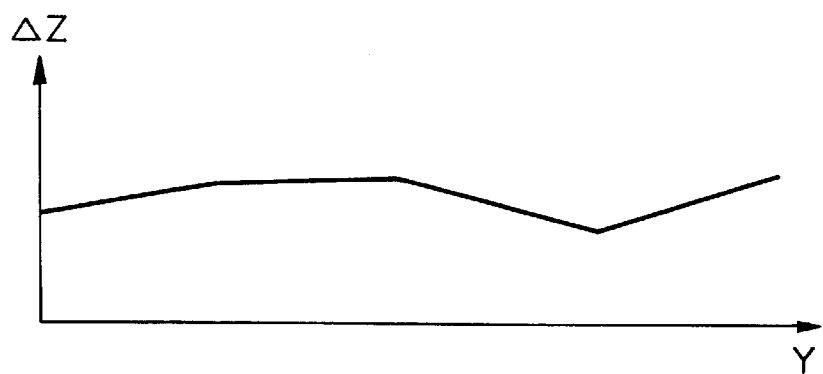
FIG. 8(a) is a graph showing the change of the focus position as a controlled variable obtained in correspondence to the Y-coordinate of the wafer from the distribution of focus positions shown in FIG. 7.
Figure 8B:
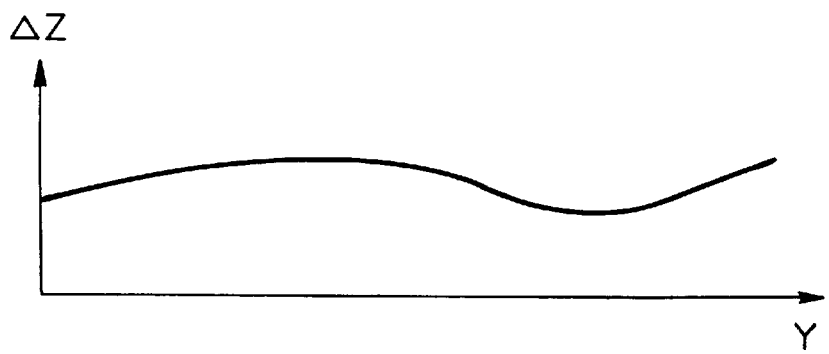
FIG. 8(b) is a graph showing a curvilinear approximation of the focus position shown by a polygonal line in FIG. 8(a)

More specifically, FIG. 8(a) shows the relationship between the Y-coordinate and the focus position $\Delta Z$ obtained in correspondence to FIG. 7. In FIG. 8(a), the focus position $\Delta Z$ changes in the shape of a polygonal line owing to the fact that the number of focus position detecting points is finite. Therefore, to smooth the operation of the driving unit for the Z-tilt stage 10, the focus position $\Delta Z$ is approximated by a higher-order function of the Y-coordinate. An example of the focus position $\Delta Z$ obtained as a result of the approximation is shown in FIG. 8(b). Thereafter, in FIG. 6, the illumination field 3 is started to approach from the approach start point 18A. After the illumination field 3 has reached the shot area SA8, application of exposure light is started, and the focus position and tilt angles of the wafer W are set to the values obtained in advance in correspondence to the Y-coordinate of the wafer W through the Z-tilt stage 10. Thus, scanning exposure is carried out in a state where the whole surface of the shot area SA8 is brought into focus substantially to the image plane of the projection optical system PL.

Upon completion of the scanning exposure for the shot area SA8, deceleration is performed. Consequently, the center of the illumination field 3 reaches a scanning exposure end point 18B. Thereafter, the wafer stage 9 performs stepping in the X direction, causing the center of the illumination field 3 to move to an approach start point 18C for a subsequent shot area SA9. The distance between the illumination field 3 and the shot area SA9 has also been set to a length $L_{pre,max}$ determined by Eq.(1). Accordingly, as will be clear from FIG. 5, the shot area SA9 is substantially covered by the measuring area 15R for the multipoint AF sensor 14R. In this state, the main control system 7 measures the focus positions at 15 detecting points $Q_{11}$ to $Q_{53}$ set in a matrix with 5 rows and 3 columns in the measuring area 15R, i.e., the shot area SA9, through the multipoint AF sensor 14R, and predetermines a focus position $\Delta Z$ and tilt angles $\theta_X$ and $\theta_Y$ for bringing the surface of the shot area SA9 into focus to the image plane as in the case of the shot area SA8. After the illumination field 3 has begun to approach, the surface of the wafer W is brought into focus at the image plane by the autofocusing method and the autoleveling method on the basis of the predetermined focus position $\Delta Z$ and so forth.

A similar control operation is executed to carry out exposure for other shot areas. That is, a distribution of focus positions in a shot area to be exposed is measured in advance at an approach start point by selectively using the multipoint AF sensor 14F or 14R according to the scanning direction, and controlled variables (focus position and tilt angles) to be used to control the surface position of the wafer W during scanning exposure are predetermined on the basis of the result of the measurement. Then, the Z-tilt stage 10 is driven on the basis of the predetermined controlled variables. In a case where a focusing operation is executed on the basis of the result of measurement carried out substantially in real time as in the prior art, the response speed of the focusing operation is determined by the overall response speed of the servo system comprising the AF sensor signal processing system and the stage system. In contrast, the response speed of the focusing operation in this embodiment depends substantially only on the Z-tilt stage 10. Therefore, follow-up control can be effected at high speed and smoothly irrespective of a steep change in unevenness on the surface of the wafer W. Thus, the incidence of resolution failures or other similar defects is reduced. Further, the wafer stage 9 need not be moved from each approach start point to measure a distribution of focus positions in each shot area. Therefore, the throughput of the exposure process is not reduced.

In this embodiment, when a distribution of focus positions in a shot area to be exposed subsequently is measured at the approach start point, it may be found that there is an uneven spot that exceeds the response speed of the Z-tilt stage 10 due to the adhesion of a foreign matter to the obverse or reverse surface of the wafer, for example. In such a case, controlled variables for the Z-tilt stage 10 may be determined by excluding information concerning the unevenness in advance. In this case, the shot area concerned has a likelihood that a resolution failure will occur locally in a portion having the unevenness. However, optimal focusing can be effected in the rest of the shot area.

In this embodiment, the operation of predetermining controlled variables for the Z-tilt stage 10 to effect autofocusing and autoleveling is desirably executed in parallel to the movement of the wafer stage 9 from the scanning exposure end point for the preceding shot area to the approach start point for the subsequent shot area. More specifically, when the wafer stage 9 has reached the vicinity of the approach start point for the subsequent shot area, the measuring area 15F or 15R substantially covers the entire surface of the subsequent shot area. Therefore, in this state, the operation of measuring the focus positions at the detecting points is started, and at the same time as the wafer stage 9 reaches the approach start point, the focus position measuring operation is terminated, and then controlled variables for the Z-tilt stage 10 are calculated, thereby making it possible to maximize the throughput of the exposure process.

In the case of FIG. 6, the size of each of the shot areas SA1 to SAN is approximately the same as the size of the maximum exposure field, and the scanning speed of the wafer stage 9 is the maximum scanning speed. Therefore, in a case where the illumination field 3 is scanned in the +Y direction in FIG. 5, the focus positions at all the detecting points $P_{11}$ to $P_{53}$ in the measuring area 15F are measured at the approach start point. However, when the size of each shot area is smaller than the maximum exposure field or in a case where the scanning speed of the wafer stage 9 is lower than the maximum scanning speed and hence the length of the approach section may be shorter, the position of the accelerating start point (the approach start point) should be changed correspondingly by a command from the main control system 7, and the arrangement of focus position detecting points should be changed in advance. Alternatively, the operator of the projection exposure apparatus may preset desirable detecting points on the basis of the design data concerning semiconductor devices, for example, which are to be fabricated by exposure. To cope with a situation in which the approach section is short, the distance from the illumination field 3 to each of the measuring areas 15F and 15R in FIG. 5 may be previously set shorter than $L_{pre,max}$.

Next, another embodiment of the present invention will be described with reference to FIGS. 1, 9 and 10. In this embodiment also, a step-and-scan type projection exposure apparatus having basically the same arrangement as in FIG. 1 is used. However, the projection exposure apparatus in this embodiment has, in addition to the first and second wide-area detection type multipoint AF sensors 14F and 14R, a third multipoint AF sensor 20 disposed between the multipoint AF sensors 14F and 14R, as shown by the chain double-dashed line in FIG. 1.

FIG. 9 shows a distribution of focus position detecting points for the three multipoint AF sensors 14F, 14R and 20 in this embodiment. Referring to FIG. 9, measuring areas 15F and 15R for the wide-area detection type multipoint AF sensors 14F and 14R are set apart from the illumination field 3 in the +Y and −Y directions by sections 16F and 16R, respectively, each having a length $L_{pre,max}$. Slit images from the third multipoint AF sensor 20 in the center of FIG. 1 are obliquely projected onto five detecting points 21A to 21E arranged in the illumination field 3, three detecting points 22FA to 22FC arranged in the X direction in the section 16F, and three detecting points 22RA to 22RC arranged in the X direction in the section 16R. Reflected light from the detecting points 21A to 21E, 22FA to 22FC, and 22RA to 22RC is received by the third multipoint AF sensor 20, and focus signals corresponding to the focus positions at these detecting points are supplied to the main control system 7 in FIG. 1.

In this case, the sections 16F and 16R serve as approach sections when the illumination field 3 is at an approach start point. During approach and synchronous scanning, the sections 16F and 16R serve as focus position preread areas or prefocus areas. The focus positions at the detecting points 21A to 21E in the illumination field 3 are detected at all times. When the illumination field 3 is scanned relative to the wafer in the +Y direction, the focus positions at the detecting points 22FA to 22FC in the section 16F on the +Y side are continuously detected. When the illumination field 3 is scanned relative to the wafer in the −Y direction, the focus positions at the detecting points 22RA to 22RC in the section 16R on the −Y side are continuously detected.

Next, an example of the scanning exposure operation in this embodiment will be described. In FIG. 9, to carry out exposure by scanning the illumination field 3 in the +Y direction relative to a shot area to be exposed, the focus positions at the detecting points $P_{11}$ to $P_{53}$ in the measuring area 15F are measured in advance at the approach start point. That is, a distribution of focus positions in the shot area is measured in advance to predetermine controlled variables for the Z-tilt stage 10 in FIG. 1 to bring the wafer surface in the illumination field 3 into focus to the image plane in correspondence to the Y-coordinate as in the case of the method described in connection with FIG. 6. After the wafer has begun to approach, the focus positions at the detecting points 21A to 21E in the illumination field 3 and at the detecting points 22FA to 22FC in the section 16F are continuously measured. After the detecting points 22FA to 22FC in the section 16F (preread area in this case) have reached the shot area to be exposed, information concerning the focus positions at the detecting points 22FA to 22FC is fed back to finely correct the predetermined controlled variables for the Z-tilt stage 10. After the illumination field 3 has entered the shot area to be exposed, information concerning the focus positions at the detecting points 21A to 21E is also fed back to finely correct the controlled variables for the Z-tilt stage 10. While doing so, scanning exposure is carried out. The feedback gain used in this case should be optimized by taking into consideration the responsivity of the Z-tilt stage 10.

As is clear from FIG. 9, the focus position detecting points $P_{11}$ to $P_{53}$ where detection is performed at the approach start point are distributed substantially uniformly in the shot area to be exposed, but an area where the focus position is not measured is present between each pair of adjacent detecting points. In contrast, the detecting points in the illumination field 3 and those in the section (preread area) 16F move continuously in the Y direction over the surface of the shot area during scanning exposure; therefore, the focus position is continuously measured in the Y direction. Accordingly, by feeding back the focus positions at the detecting points in the illumination field 3 and the preread area, it is possible to cope with even small unevenness (undulation) on the surface of the shot area. Thus, focusing can be effected with higher accuracy.

In FIG. 9, to carry out exposure by scanning the illumination field 3 relative to a shot area to be exposed in the −Y direction, the focus positions at the detecting points $Q_{11}$ to $Q_{53}$ in the measuring area 15R are measured in advance, and controlled variables for the Z-tilt stage 10 in FIG. 1 are predetermined from the result of the measurement. After the wafer has been started to approach, the focus positions at the detecting points 21A to 21E in the illumination field 3 and at the detecting points 22RA to 22RC in the section 16R are continuously measured. During scanning exposure, information concerning the measured focus positions is fed back to finely correct the controlled variables for the Z-tilt stage 10. Thus, the focusing accuracy is improved.

Next, an example of an operation carried out to effect scanning exposure for a partly-cut shot area near the edge of a wafer will be described with reference to FIG. 10.

Figure 10:
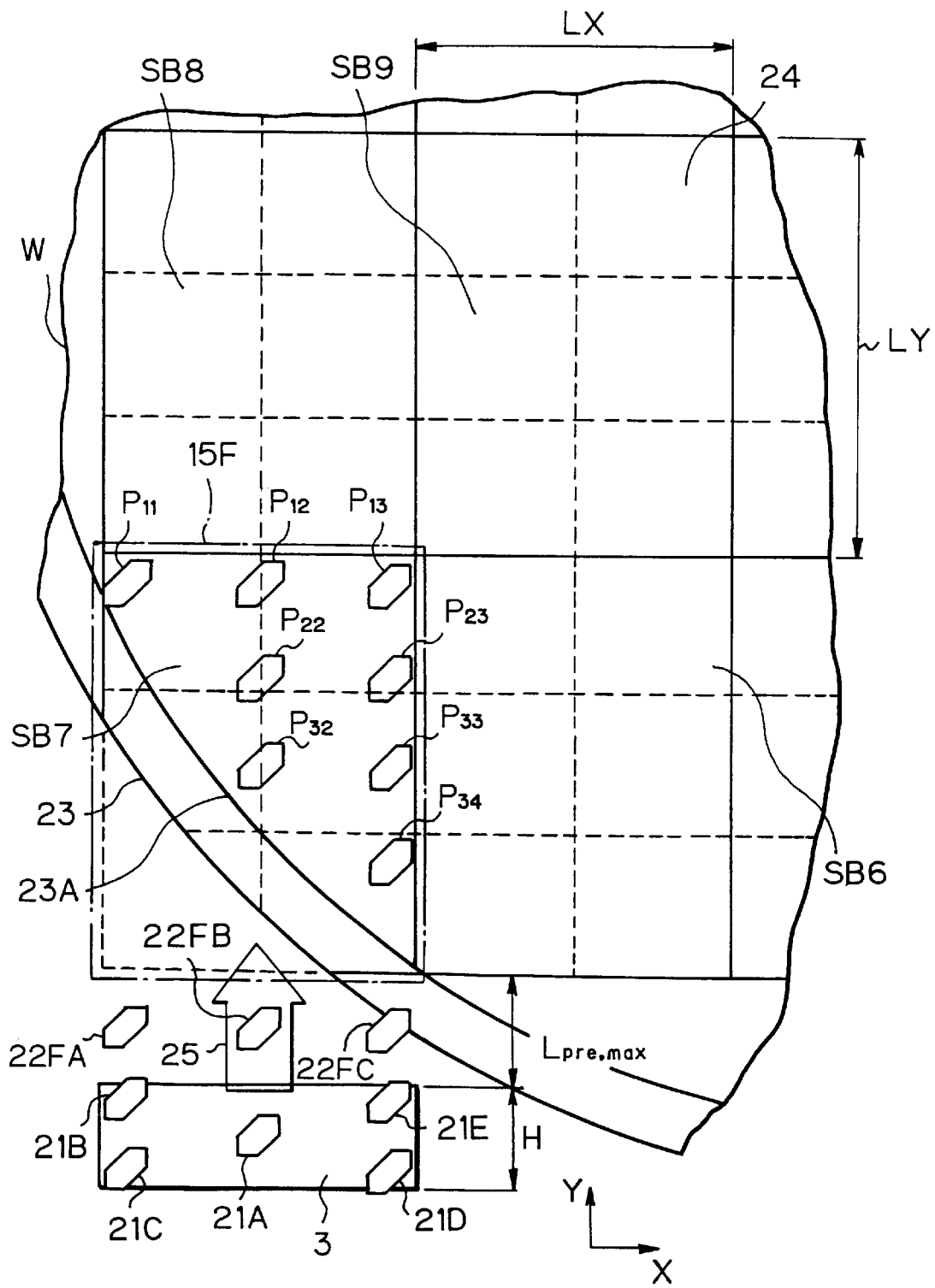
FIG. 10 is a diagram for explanation of scanning exposure carried out for a shot area near the edge of a wafer in the embodiment of the present invention.

FIG. 10 is an enlarged plan view of an edge portion of a predetermined wafer W to be exposed. Referring to FIG. 10, the wafer W has shot areas SB6 to SB9 disposed near the edge thereof at a predetermined pitch in each of the X and Y directions. Among the shot areas SB6 to SB9, the shot area SB7 has a part thereof cut by the edge. It should be noted that because there are considerable variations in unevenness near the edge of wafers in general, many control systems for projection exposure apparatus assume not a geometrical edge 23 but a virtual edge 23A slightly (about 3 millimeters in general) inward of the edge 23. Therefore, in this embodiment also, shot areas within the edge 23A are regarded as effective areas. It is also assumed that the shot areas SB6 to SB9 are 6-chip shot areas, in each of which the same circuit pattern is formed in six regions arranged in a matrix with 3 rows in the Y direction and 2 columns in the X direction. That is, assuming that the width in the X direction of each shot area is LX and the width in the Y direction is LY, six circuit patterns 24 are formed in each shot area, provided that the shot area has no cut portion. Each circuit pattern 24 has a width LX/2 in the X direction and a width LY/3 in the Y direction. Accordingly, even in the shot area SB7, which is partly cut by the edge 23A, two complete circuit patterns, for example, can be formed.

In the above-described shot layout, scanning exposure is carried out for the partly-cut shot area SB7 by scanning the illumination field 3 relative to the shot area SB7 in the +Y direction from the outside of the wafer W as shown by the arrow 25 (in actuality, the wafer moves outwardly). In this case, the main control system 7 can previously recognize the configuration of effective regions in the shot area SB7 to be exposed from information concerning the wafer configuration and the shot array. Therefore, as shown in FIG. 10, with the illumination field 3 moved to an approach start point for the shot area SB7, the main control system 7 predetermines controlled variables to be used to control the Z-tilt stage 10 during scanning exposure by using only the focus positions at eight detecting points $P_{11}$ to $P_{34}$ which are inside the edge 23A and within the shot area SB7 among the detecting points in the measuring area 15F for the first wide-area detection type multipoint AF sensor 14F, and performs approach and scanning exposure on the basis of the predetermined controlled variables.

When the illumination field 3 is at the approach start point, the detecting points 22FA to 22FC in the preread area on the +Y side of the illumination field 3 and the detecting points 21A to 21E in the illumination field 3 are outside the edge 23A of the wafer W. Even after the starting of approach and scanning exposure, it is immediately before the termination of the scanning exposure that all detecting points arranged in a direction perpendicular to the scanning direction (e.g., the detecting points 22FA to 22FC) enter effective areas inside the edge 23A. Therefore, the real-time feedback quantities of the focus positions at the detecting points in the preread area and the illumination field 3 to correct the controlled variables for the Z-tilt stage 10 are reduced, unlike the control operation in the case of FIG. 9. If the shot area to be exposed is cut to a considerable extent by the wafer edge, autofocusing and autoleveling are carried out only by open control using the predetermined controlled variables without feeding back the focus positions at the detecting points in the preread area and the illumination field 3. Thus, focusing can be accurately performed even for a partly-cut shot area without moving the wafer stage 9 from the approach start point to measure focus positions.

Although in the foregoing embodiments the detecting points in the measuring areas 15F and 15R for the wide-area detection type multipoint AF sensors 14F and 14R are uniformly distributed in a matrix with 5 rows and 3 columns, it should be noted that the number and arrangement of these detecting points are not necessarily limited to those in the described embodiments. Thus, the present invention is not limited to the above-described embodiments but may adopt various arrangements without departing from the scope of the present invention.

According to the scanning exposure method, a distribution of positions (focus positions) in the optical axis direction of the projection optical system in an area to be exposed is measured at an accelerating start position of the substrate, that is, at an approach start position of the substrate, and the surface position of the substrate during scanning exposure is set on the basis of the result of the measurement. Accordingly, even in a case where there is a great change in unevenness on the surface of the area to be exposed, the surface of the area can be accurately brought into focus to the image plane without reducing the throughput. Further, because the control responsivity of the stage system for setting the surface position of the substrate no longer gives rise to a problem during approach, the incidence of retry of an approach operation due to a control failure reduces, and thus the throughput further improves.

In a case where after the substrate has begun to approach (accelerate), the position of the substrate surface in the optical axis direction of the projection optical system is remeasured, and the controlled variables for the substrate used to set the surface position of the substrate are corrected on the basis of the remeasured position in the optical axis direction, information concerning even a slight uneven point in the area to be exposed can be reflected. Therefore, focusing can be effected with higher accuracy.

In a case where the positions in the optical axis direction of the projection optical system at a plurality of points on the surface of a shot area to be exposed subsequently among a plurality of shot areas on the substrate are measured at an approach start position of the substrate, scanning exposure can be performed with substantially the whole surface of the shot area placed in a focused state by using information concerning the premeasured focus positions.

In a case where the distribution of detecting points for measuring the position in the optical axis direction of a shot area to be exposed subsequently at an approach start position of the substrate is changed according to the configuration of the shot area, even when exposure is to be carried out for a partly-cut shot area near the edge of the substrate, for example, by scanning the exposure field relative to the shot area from the outside of the substrate, focusing can be accurately performed by using only information concerning the focus positions at detecting points inside the substrate.

According to the scanning exposure apparatus to attain the second object of the present invention, the scanning exposure method according to the present invention can be effectively carried out. In a case where a measuring area for a measuring system is determined on the basis of the acceleration of the substrate during the approach thereof and the speed of the substrate during scanning exposure, the measuring area can be accurately set over a shot area to be exposed at an approach start point of the substrate.

Next, an embodiment of the present invention to attain the third and fourth objects thereof will be described with reference to FIGS. 12 to 15. In this embodiment also, the present invention is applied to an exposure process carried out by using a step-and-scan type projection exposure apparatus.

Figure 12:
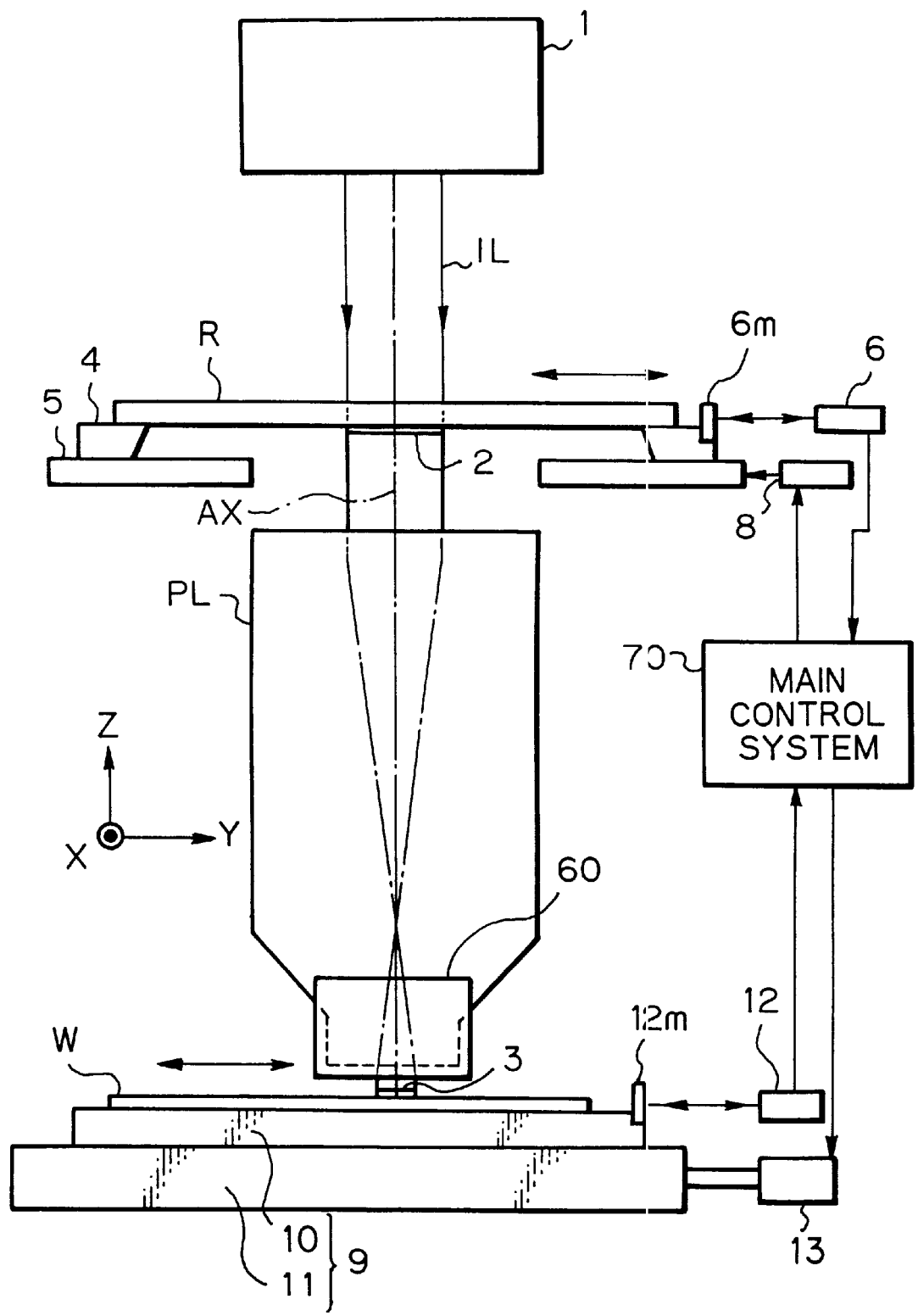
FIG. 12 is a schematic diagram showing the arrangement of a step-and-scan type scanning exposure apparatus used in an embodiment of the present invention.

The projection exposure apparatus shown in FIG. 12 differs from that shown in FIG. 1 in the contents of control effected by a main control system 70 (an example of the contents of control by the main control system 70 is shown in the flowcharts of FIGS. 18(a), 18(b), 18(c) and 18(d)) and in the arrangement of an autofocus sensor 60. In regard to the other portions, the projection exposure apparatus is the same as that shown in FIG. 1. Therefore, the same portions or elements are denoted by the same reference characters, and a detailed description thereof is omitted.

An autofocus sensor in this embodiment will be described below. An optical oblique incidence type multipoint autofocus sensor (hereinafter referred to as "multipoint AF sensor") 60 is installed on the side of a lower portion of the projection optical system PL.

Figure 13:
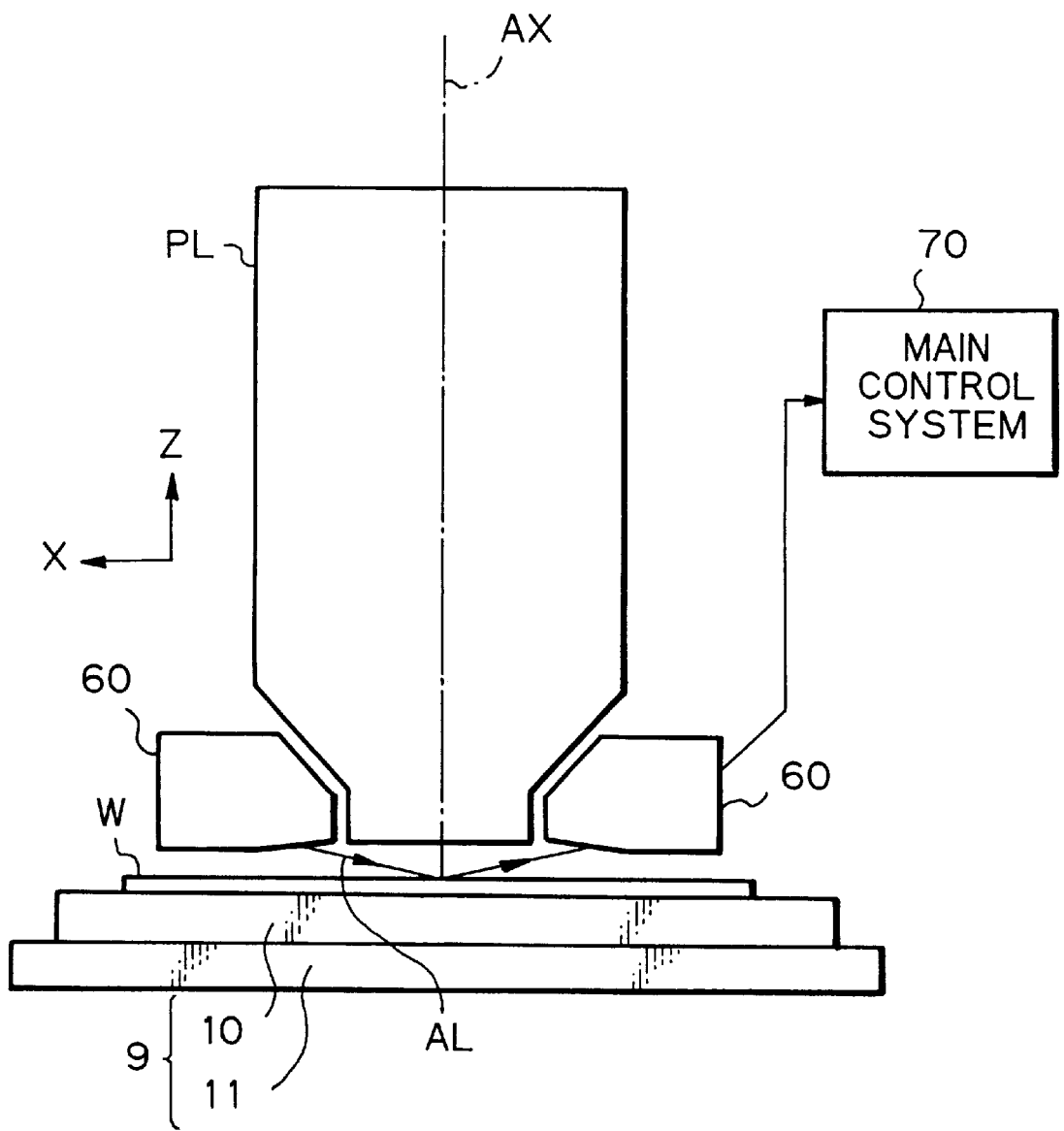
FIG. 13 is a side view of an essential part of the arrangement shown in FIG. 12 as seen from the +Y direction.

FIG. 13 is a side view of the projection exposure apparatus shown in FIG. 12 as seen from the +Y direction. Referring to FIG. 13, the multipoint AF sensor 60 comprises an illumination optical system 60a and a light-receiving optical system 60b. The illumination optical system 60a projects a plurality of slit images onto a plurality of detecting points on the wafer W obliquely to the optical axis AX of the projection optical system PL under the application of detecting light AL to which the photoresist used is not sensitive. Reflected light from these detecting points passes through a vibrating slit plate, for example, in the light-receiving optical system 60b and re-forms the corresponding slit images on a plurality of photoelectric converting elements, respectively. Detected signals from the photoelectric converting elements are synchronously rectified by a driving signal for the vibrating slit plate, for example, thereby generating focus signals each changing approximately in proportion to the focus position at the corresponding detecting point within a predetermined range. In this embodiment, calibration is performed in advance so that these focus signals are zero when the corresponding detecting points are coincident with a prolongation of the image plane (best focus position) of the projection optical system PL. The main control system 70 can recognize from the focus signals the focus positions (to be precise, amounts of deviation from the best focus position) at the corresponding detecting points.

Figure 14:
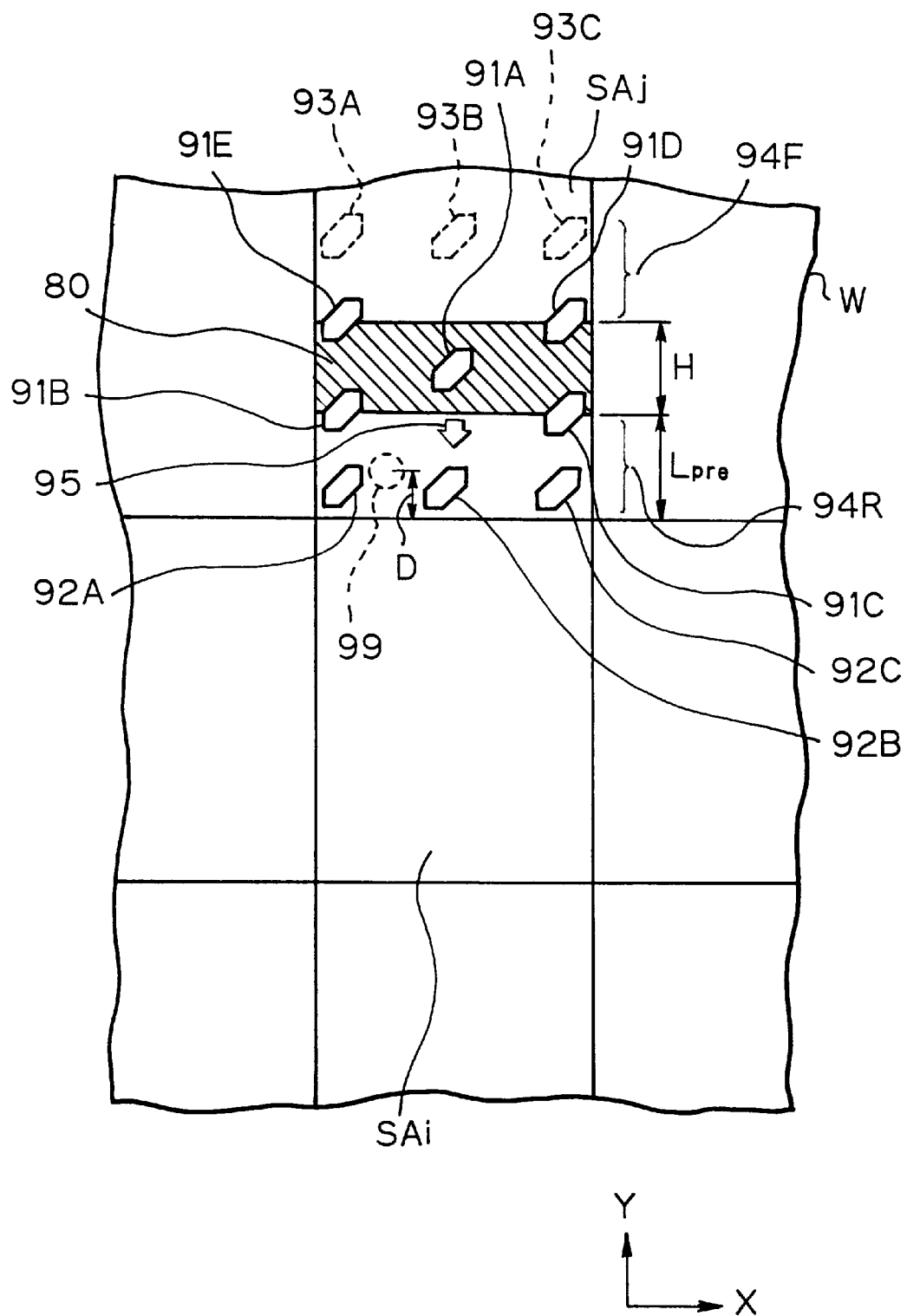
FIG. 14 is a diagram showing the distribution of focus position detecting points in the embodiment.

FIG. 14 shows a distribution of focus position detecting points for the multipoint AF sensor 60 in this embodiment. Referring to FIG. 14, sections 94F and 94R are set on the +Y and −Y sides, respectively, of an illumination field 80. The sections 94F and 94R each have a length $L_{pre}$ in the Y direction. When the illumination field 80 is at an approach start point, each of the sections 94F and 94R serves as an approach section, as described later. During approach and scanning exposure, each of the sections 94F and 94R serves as a focus position preread area or a prefocus area. The illumination field 80 has five detecting points 91A to 91E set in the center and four corners thereof. The section 94R, which lies on the −Y side of the illumination field 80, has three detecting points 92A to 92C set therein in a row extending in the X direction. The section 94F, which lies on the +Y side of the illumination field 80, also has three detecting points 93A to 93C set therein in a row extending in the X direction. The multipoint AF sensor 60 in FIG. 12 projects slit images onto the detecting points 91A to 91E, 92A to 92C, and 93A to 93C. Thus, the focus positions at these detecting points are continuously measured.

In this case, the length $L_{pre}$ of each of the sections 94F and 94R is set equal to an approach distance (length of an approach section) traveled by the wafer W when the wafer stage 9 in FIG. 12 is moved in the Y direction at a predetermined scanning speed $V_W$. Assuming that the acceleration in the Y direction of the wafer stage 9 during approach is a, the length Lpre may be approximately given by $$L_{pre}=V_W^2/(2a) \qquad (3)$$

More specifically, assuming that the scanning speed $V_W$ is 100 mm/s and the acceleration a is 1000 mm/s$^2$, the length $L_{pre}$ of each of the sections 94F and 94R is determined to be 5 millimeters from Eq.(3).

Let us assume that, as shown in FIG. 14, when scanning exposure is to be carried out for a shot area SAi on the wafer W, the illumination field 80 starts relative movement in the −Y direction from an approach start point in a shot area SAj adjacent to the shot area SAi (in actuality, the wafer W is moved in the +Y direction). On this assumption, the focus positions at the detecting points 91A to 91E in the illumination field 80 and those at the detecting points 92A to 92C in the section (preread area) 94R on the −Y side of the illumination field 80 are continuously detected. On the basis of the result of the detection at the detecting points 92A to 92C in the preread area, the main control system 70 calculates a focus position ΔZ of the wafer W, together with a tilt angle $\theta_X$ about the X-axis of the wafer W (i.e., pitching in the scanning direction) and a tilt angle $\theta_Y$ about the Y-axis of the wafer W (i.e., rolling relative to the scanning direction), to bring the surface of the wafer W in the illumination field 80 into focus to the image plane of the projection optical system PL in correspondence to the Y-coordinate of the wafer W during scanning exposure, and sets controlled variables for the Z-tilt stage 10 from the calculated values.

Further, the focus positions at the detecting points 91A to 91E in the illumination field 80, which is the actual exposure area, are fed back to correct the controlled variables, and while doing so, the Z-tilt stage 10 is driven to bring the surface of the wafer W in the illumination field 80 into focus to the image plane of the projection optical system PL on the basis of an average focus position and tilt angles. Thus, the surface of the wafer W in the illumination field 80 is continuously brought into focus to the image plane by the autofocusing method and the autoleveling method. In this state, application of exposure light is started after the illumination field 80 has reached the shot area SAi, thereby carrying out scanning exposure. When there is no abnormal step area (an area markedly different in the focus position from the surrounding area) in the approach section, exposure is carried out in a state where the entire surface of the shot area SAi is brought into focus substantially to the image plane of the projection optical system PL.

When the illumination field 80 is scanned relative to the wafer in the +Y direction, the focus positions at the detecting points 91A to 91E in the illumination field 80 and those at the detecting points 93A to 93C in the section 94F on the +Y side of the illumination field 80 are continuously detected, thereby enabling exposure to be carried out in a focused state attained by the autofocusing method and the autoleveling method.

Incidentally, if, in FIG. 14, there is an abnormal step area 99 in an approach section (section 94R in this case) when exposure is to be carried out for the shot area SAi, for example, there is a likelihood of defocus remaining even when the illumination field 80 has reached the shot area SAi, depending upon the response speed of the servo system comprising the multipoint AF sensor 60, the main control system 70 and the Z-tilt stage 10. More specifically, immediately after the approach has been started, the movement speed of the wafer stage 9 is low, and the preread of the focus positions is in progress. Therefore, the servo system including the Z-tilt stage 10, etc., undesirably follows up the abnormal step area 99, and because the movement speed of the wafer stage 9 gradually increases, it may be impossible to make the focus position correction satisfactorily after the illumination field 80 has passed the abnormal step area 99.

Therefore, a criterion for a judgment as to whether or not the abnormal step area 99 will cause defocus in the shot area SAi is obtained by using a simple model. In this model, control parameters for approach are assumed to be a scanning speed $V_W$ of the wafer stage 9 relative to the shot area SAi and an acceleration a. The time $T_L$ required for the leading end of the illumination field 80 to reach the shot area SAi from the approach start point is given by $$T_L = V_W/a \quad (4)$$

Assuming that the planar size of the abnormal step area 99 may be ignored, the distance from the abnormal step area 99 to the shot area SAi is denoted by D, and the variation in focus position at the abnormal step area 99 from the surrounding area is denoted by $\Delta F$. Assuming that the wafer stage 9 is accelerated at a constant acceleration a, the time $T_X$ required for the leading end of the illumination field 80 to reach the abnormal step area 99 from the approach start point is given by $$T_X = \{2(L_{pre} - D)/a\}^{1/2} \quad (5)$$

-continued
$$= \{V_W^2/a^2 - (2 \cdot D)/a\}^{1/2}$$

Accordingly, assuming that the time required for the illumination field 80 to reach the shot area SAi from the abnormal step area 99 is T(D), the time T(D) may be expressed as a function $f(V_W, a, D)$ of the control parameters ($V_W$, a) and the distance D from Eqs.(4) and (5) as follows:

$$T(D)=f(V_W, a, D)=T_L-T_X=V_W/a-\{V_W^2/a^2-(2\cdot D)/a\}^{1/2} \quad (6)$$

Assuming that the response speed of the servo system including the Z-tilt stage 10, etc., is α(the maximum variation of the focus position per unit time); the depth of focus determined by the projection optical system PL and an object to be exposed is ±ε; the variation in focus position at the abnormal step area 99 is ΔF; and the control time required to restore the variation in focus position to a level at which no defocus will occur is T(ΔF, ε), the control time T (ΔF, ε) may be approximately given, for example, by $$T(\Delta F, \epsilon)=(\Delta F-\epsilon)/\alpha \quad (7)$$

In this case, if the required control time T(ΔF, ε) exceeds the actual lapse time T(D), defocus occurs in the shot area SAi after the illumination field 80 has passed the abnormal step area 99. In other words, it is recognized according to the simple model in this embodiment that the abnormal step area 99 will cause defocus in the shot area SAi when the following condition holds:

$$T(\Delta F, \epsilon)>T(D) \quad (8)$$

The main control system 70 in this embodiment has the function of calculating Eqs. (6) and (7) and the function of judging whether or not an abnormal step area will cause defocus from Eq. (8).

Next, an example of an exposure operation carried out by the projection exposure apparatus according to this embodiment when an abnormal step area is present in an approach section will be described with reference to FIGS. 15(a) and 15(b).

Figure 15A:
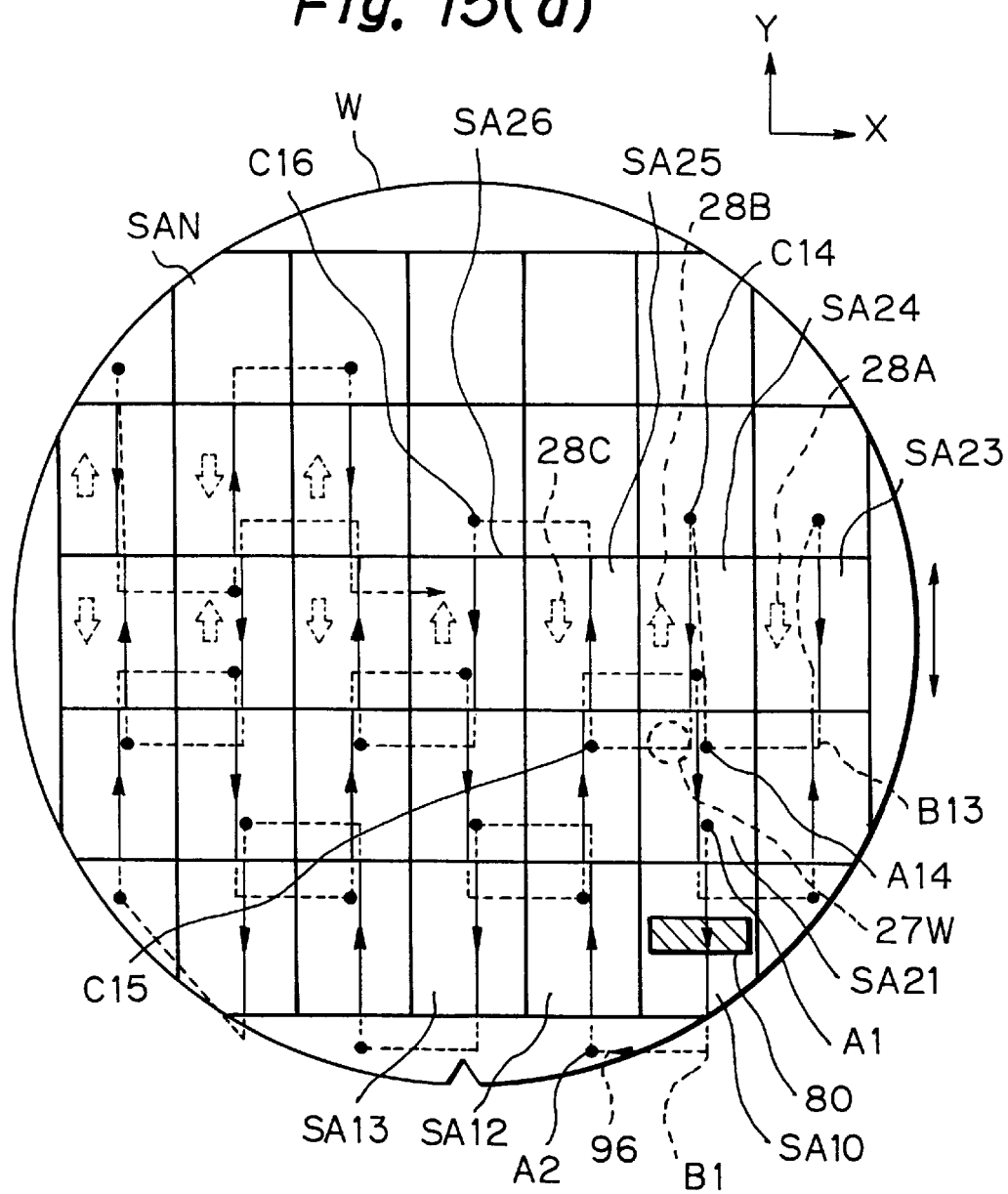
FIG. 15(a) is a plan view of a wafer for explanation of a scanning exposure operation of the embodiment.
Figure 15B:
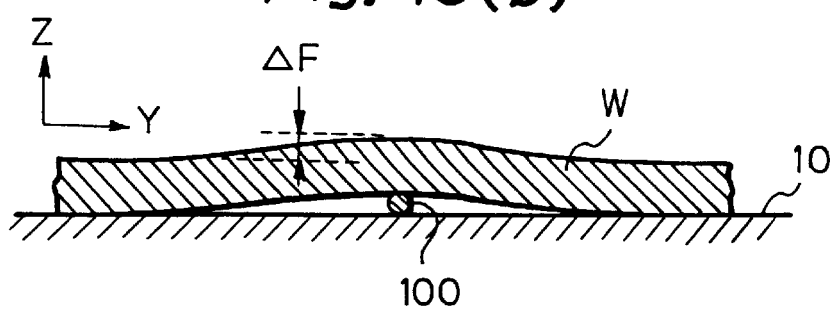
FIG. 15(b) is a fragmentary enlarged sectional view of an abnormal step area in FIG. 15(a)

FIG. 15(a) shows a wafer W to be exposed in this embodiment. Referring to FIG. 15(a), the wafer W has shot areas SA10, SA12, . . . , SAN (N is an integer of 2 or higher) formed on the surface thereof at a predetermined pitch in each of the X and Y directions. It is assumed that a pattern image of the reticle R is transferred onto the shot areas SA10 to SAN by scanning exposure in order from the shot area SA10 through the shot areas SA12, SA13, . . . to the shot area SAN. More specifically, at the time of starting scanning exposure for the first shot area SA10, the center of the illumination field 80 lies at an approach start point A1. Thereafter, the wafer W begins to approach, and the Z-tilt stage 10 is driven on the basis of the result of detection by the multipoint AF sensor 60, thereby enabling the surface of the wafer W in the illumination field 80 to be continuously brought into focus by the autofocusing method and the autoleveling method.

While the illumination field 80 is in the approach section, the main control system 70 continuously judges whether or not there is an abnormal step area that satisfies the condition expressed by Eq.(8) until the application of exposure light is started. After the illumination field 80 has reached the shot area SA10, the application of exposure light is started. The illumination field 80 is moved relative to the wafer W in the −Y direction to a deceleration end point B1 along a path 96, and the application of exposure light is suspended when the illumination field 80 leaves the shot area SA10. Thus, the pattern image of the reticle R is transferred onto the shot area SA10. In actuality, the wafer W (wafer stage 9) is moved relative to the fixed illumination field 80. However, it is assumed for the sake of explanation that the illumination field 80 moves relative to the wafer W.

Thereafter, the wafer stage 9 performs stepping to move the illumination field 80 to an approach start point A2 for the subsequent shot area SA12. Then, the illumination field 80 is moved relative to the wafer W in the reverse direction to the above, thereby carrying out exposure for the shot area SA12. In the original exposure sequence, the scanning direction of the wafer W is reversed every time the exposure process shifts to the subsequent shot area. The reason for this is as follows: As will be understood from FIG. 12, the reticle stage 4 (reticle R) has a structure that is scanned sidewardly. Therefore, from the viewpoint of increasing the throughput by avoiding a useless movement (idle return) of the reticle R, it is desirable to reverse the scanning direction of the reticle and the scanning direction of the wafer W corresponding thereto every time the exposure process shifts to the subsequent shot area.

Let us assume that the above-described scanning exposure has been carried out as far as the shot area SA23 in FIG. 15(*a*), and the fourteenth shot area SA24 is to be subjected to scanning exposure subsequently. It is also assumed that according to the original exposure sequence, exposure is carried out for the shot area SA24 by moving the illumination field 80 relative to the shot area SA24 in the +Y direction, and that an abnormal step area 100W is present in the approach section, that is, in an end portion of the shot area SA21, which is adjacent to the shot area SA24 in the −Y direction, in the illustrated example. The abnormal step area 100W is, as shown in FIG. 15(*b*), caused by a foreign matter 100 present between the bottom of the wafer W and the Z-tilt stage 10. The difference in focus position between the abnormal step area 100W and the surrounding area is assumed to be $\Delta F$.

In this case, the illumination field 80 is moved from the deceleration end point B13 for the preceding shot area SA23 to the approach start point A14 for the present shot area SA24 by the stepping of the wafer stage 9 in the X direction, and then starts to approach in the +Y direction. At the same time, the detection of focus positions is started through the multipoint AF sensor 60 at the detecting points 91A to 91E in the illumination field 80 and at the detecting points 93A to 93C in the section (preread area) 94F on the +Y side of the illumination field 80 in FIG. 14, and the Z-tilt stage 10 is driven on the basis of the result of the detection. Meanwhile, the main control system 70 judges whether or not there is an abnormal step area that will cause defocus in the shot area SA24 by using the maximum value ($\Delta F_{max}$) of the focus positions detected at the detecting points 93A to 93C in the preread area.

More specifically, the main control system 70 calculates the distance D from the detecting points 93A to 93C to the shot area SA24 at a predetermined sampling rate, and substitutes the distance D into Eq.(6) to calculate the time T(D) required for the illumination field 80 to enter the shot area SA24. Further, the main control system 70 substitutes the measured focus position $\Delta F_{max}$ for $\Delta F$ in Eq.(7) to calculate the control time T($\Delta F$, $\epsilon$) required to restore the focus position to the previous level. Then, the main control system 70 judges whether or not Eq.(8) is satisfied, that is, whether or not the control time T($\Delta F$, $\epsilon$) exceeds the time T(D). As a result, the main control system 70 can predict that defocus will occur in the shot area SA24, because Eq.(8) is satisfied when the detecting point 93A in the preread region passes the vicinity of the abnormal step area 100W. Therefore, the main control system 70 suspends the scanning exposure from this direction.

Thereafter, the illumination field 80 passes over the shot area SA24 without application of exposure light and stops at the approach start point C14 on the opposite side. Then, the reticle stage 4 (reticle R) in FIG. 12 moves to the opposite side. Thereafter, the illumination field 80 begins to approach in the −Y direction from the approach start point C14. Because there is no abnormal step area in the section for approach from the −Y direction, the application of exposure light is started, and the illumination field 80 passes over the shot area SA24 in the −Y direction. Thus, scanning exposure for the shot area SA24 is carried out. Thereafter, in order to improve the throughput, the wafer stage 9 performs stepping in the X direction to move the illumination field 80 to an approach start point C15 for the subsequent shot area SA25, and the illumination field 80 is moved relative to the wafer W in the +Y direction from the approach start point C15. Thus, scanning exposure for the shot area SA25 is carried out. In FIG. 15(*a*), the dotted-line arrows 28A to 28C indicate the scanning direction of the illumination field 80 specified in the exposure sequence. The scanning direction for the exposure process up to the shot area SA23 is the same as that specified in the exposure sequence. In the shot area SA24 having the abnormal step area 100W in an approach section thereof, the scanning direction is opposite to the direction specified in the exposure sequence, and also in each of the following shot areas SA25, SA26, . . . , the scanning direction is opposite to the direction specified in the exposure sequence.

Thus, according to this embodiment, if it is detected during an approach operation (approach section) that there is an abnormal step area that will cause defocus in the shot area SA24 to be exposed subsequently, the scanning exposure from the direction of the abnormal step area is suspended, but scanning exposure is carried out from the opposite direction instead. In general, there is an extremely low probability of abnormal step areas being present on both sides of a shot area. Therefore, by reversing the scanning direction as stated above, a resolution failure due to defocus will not occur in the shot area SA24. In this embodiment, the scanning direction is reversed for the shot area SA25 to be exposed subsequently to the shot area SA24 for which the scanning direction has been reversed. Accordingly, a useless movement of the stage system is avoided, and there is no reduction in throughput of the exposure process.

Figure 16:
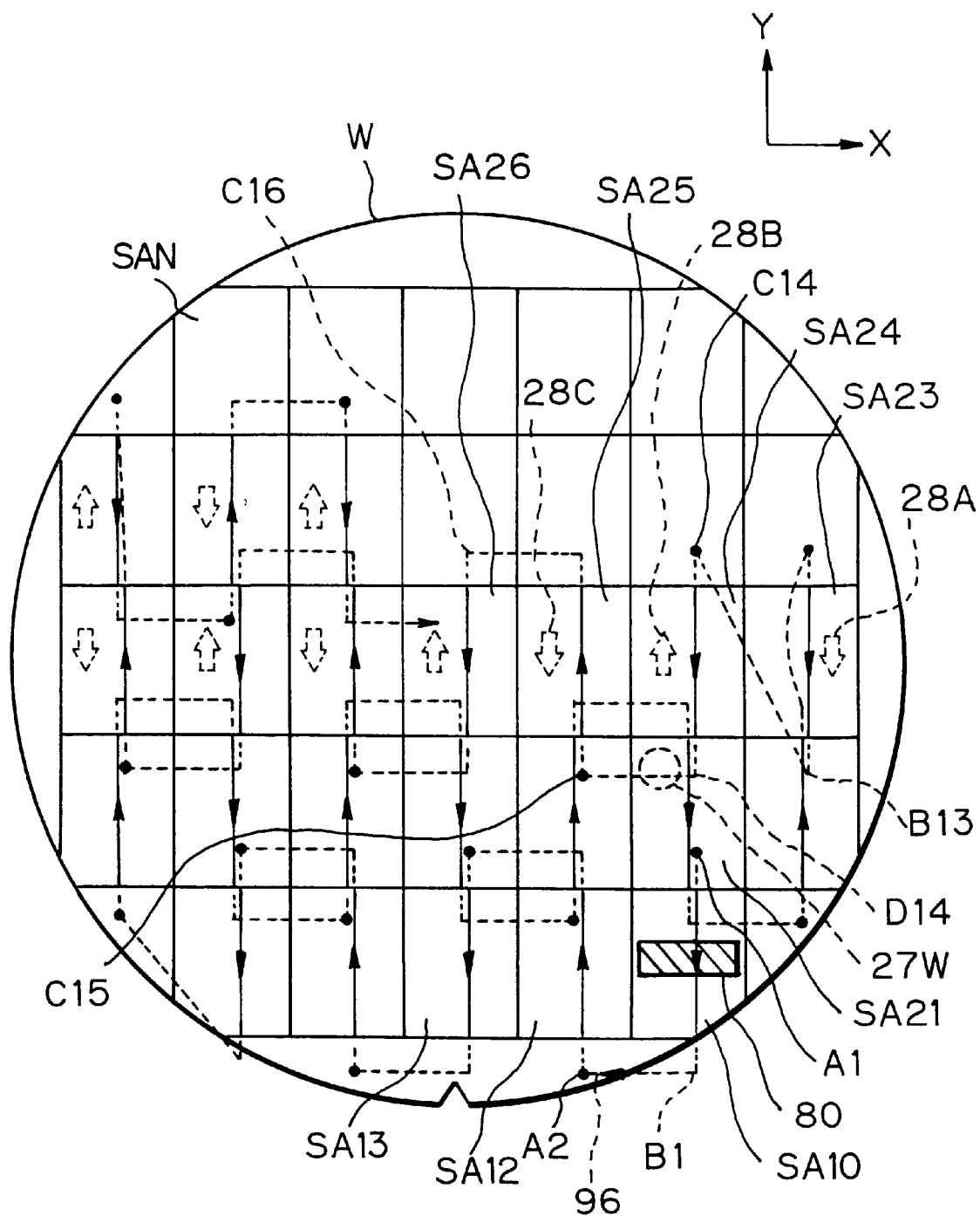
FIG. 16 is a plan view of a wafer for explanation of a scanning exposure operation in another embodiment of the present invention.

Next, another embodiment of the present invention will be described with reference to FIGS. 16 and 17. In this embodiment also, the projection exposure apparatus as shown in FIGS. 12 and 13 is used. However, this embodiment differs from the foregoing embodiment in the exposure operation for a shot area having an abnormal step area present in an approach section therefor. Therefore, an operation different from the operation stated above with reference to FIG. 15(*a*) will be described below with reference to FIG. 16. In FIG. 16, portions or elements corresponding to those shown in FIG. 15(*a*) are denoted by the same reference characters.

FIG. 16 shows a wafer W to be exposed in this embodiment. Referring to FIG. 16, to carry out scanning exposure for each of the shot areas SA10 to SAN, the detection of focus positions is carried out through the multipoint AF sensor 60 in FIG. 12, and the surface of the wafer W in the illumination field 80 is brought into focus to the image plane by the autofocusing method and the autoleveling method on the basis of the result of the detection. In this case, in a pair of shot areas SA21 and SA24 which are adjacent to each other in the scanning direction (Y direction), for example, the +Y end portion of the shot area SA21 serves as an approach section for the shot area SA24 when exposure is carried out in a predetermined exposure sequence. Therefore, during scanning exposure for each shot area SAi (i=10 to N−1), the main control system 70 in FIG. 12 successively stores, in each shot area SAi, focus positions in an area serving as an approach section for a shot area to be exposed subsequently to the shot area SAi, and previously judges from the stored focus positions whether or not there is an abnormal step area expected to cause defocus in the shot area to be exposed subsequently, that is, whether or not there is a portion that satisfies the condition expressed by Eq.(8). When it is judged that such an abnormal step area is present, the scanning direction to be taken to carry out scanning exposure for the shot area containing the abnormal step area is reversed in advance.

More specifically, it is assumed also in this embodiment that as shown in FIG. 16 an abnormal step area 100W is present in the +Y end portion of the shot area SA21, that is, in an approach section for the shot area SA24. On this assumption, when scanning exposure is being carried out for the shot area SA21 by moving the illumination field 80 in the −Y direction relative to the shot area SA21, the main control system 70 predicts on the basis of focus positions detected through the multipoint AF sensor 60 that the abnormal step area 100W will cause defocus during the scanning exposure for the shot area SA24 above the abnormal step area 100W as viewed in FIG. 16, and decides the scanning direction for the shot area SA24 to be the −Y direction.

In this case, after the illumination field 80 has reached a deceleration end point B13 upon completion of the scanning exposure in the −Y direction for the shot area SA23, the wafer stage 9 is stepped diagonally, thereby causing the illumination field 80 to move directly to the +Y side approach start point C14 for the shot area SA24. Meanwhile, idle return is also performed on the reticle stage 4 (reticle R) side. Thereafter, the illumination field 80 begins to approach in the −Y direction. Consequently, the illumination field 80 passes over the shot area SA24 and reaches a deceleration end point D14. Thus, the pattern image of the reticle R is transferred onto the shot area SA24. Thereafter, the wafer stage 9 is stepped in the X direction, causing the illumination field 80 to move to the −Y side approach start point C15 for the adjacent shot area SA25. Thereafter, scanning exposure is carried out while reversing the scanning direction.

Thus, in this embodiment, it is judged during the scanning exposure for a preceding shot area SA21 whether or not there is an abnormal step area in an approach section for a shot area SA24 subsequent to the shot area SA21, and the scanning direction for the shot area SA24 is decided from the result of the judgment. Accordingly, a resolution failure will not occur in the shot area SA24, and the throughput becomes higher than in a case where a judgment as to whether or not an abnormal step area is present is made by actually performing an approach operation for the shot area SA24.

In this embodiment also, assuming that the scanning direction set in the original exposure sequence is as indicated by the arrows 28A to 28C, the scanning direction is the same as that specified in the exposure sequence up to the shot area SA23. However, for each of the shot areas following the shot area SA23, the scanning direction is opposite to that specified in the exposure sequence. Therefore, there is no unnecessary movement in the operation when the exposure process shifts from the shot area SA24 to the shot area SA25.

In the foregoing embodiment, when overlay exposure is carried out for the second or higher layer on the wafer W, for example, the scanning direction specified in the original exposure sequence is set to the same direction as that for the preceding layer, as an example. The reason for this is that scanning exposure has a possibility that the amount of displacement will subtly vary according to the scanning direction. Therefore, it is desirable that the scanning direction for a pair of successive layers should be set to the same direction in a case where a higher degree of overlay accuracy is demanded, as is expected in the future. For this reason, it may be desirable in the foregoing embodiment that when overlay exposure is to be carried out for a shot area having no abnormal step area in an approach section therefor, the scanning direction should be set to the same direction as in the preceding layer as much as possible.

Figure 17:
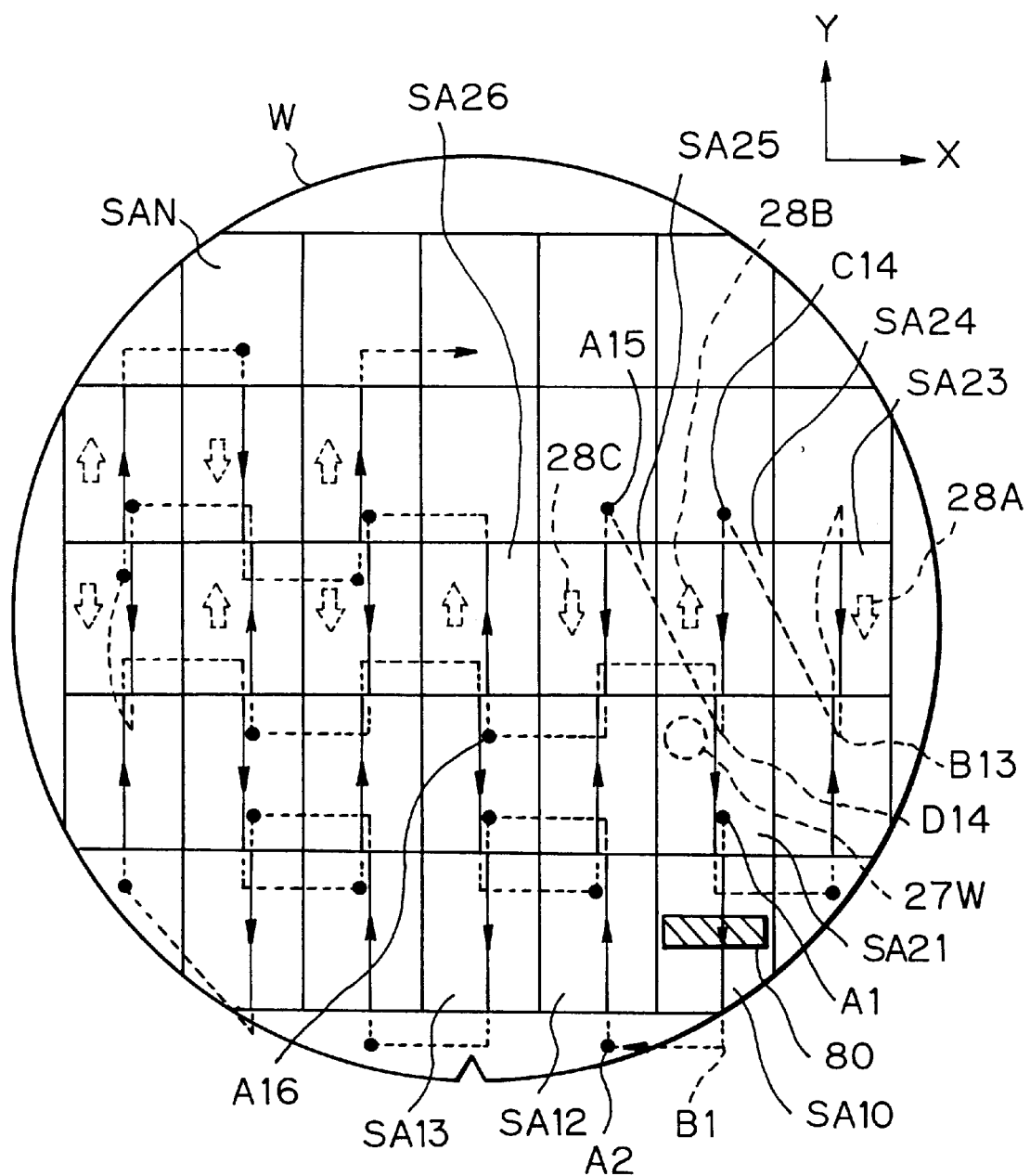
FIG. 17 is a plan view of a wafer for explanation of a scanning exposure operation in a case where the scanning direction for a shot area containing no abnormal step area is set to the same direction as that for the preceding layer in an exposure process carried out as shown in FIG. 16.
Figure 18B:
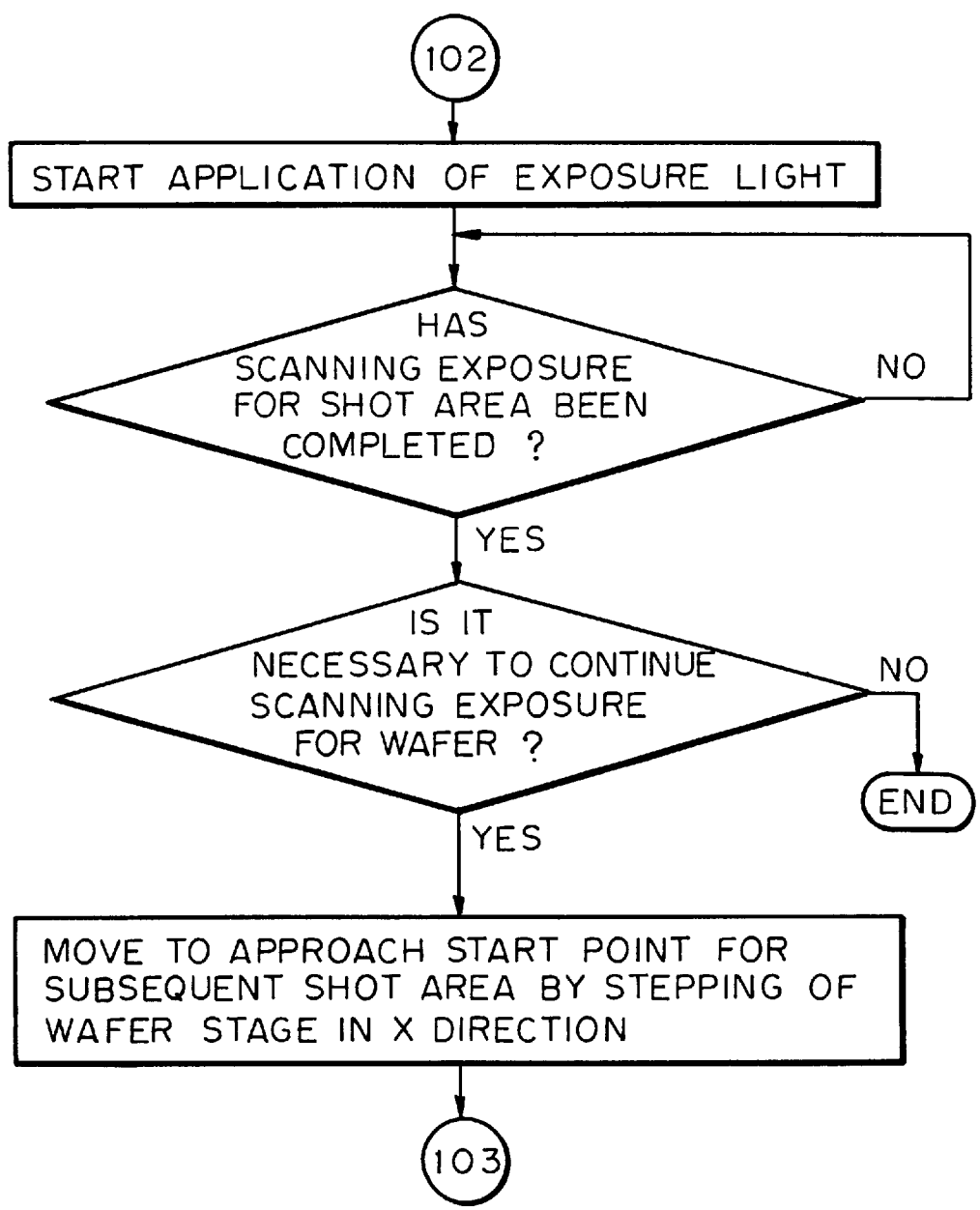
Figure 18C:
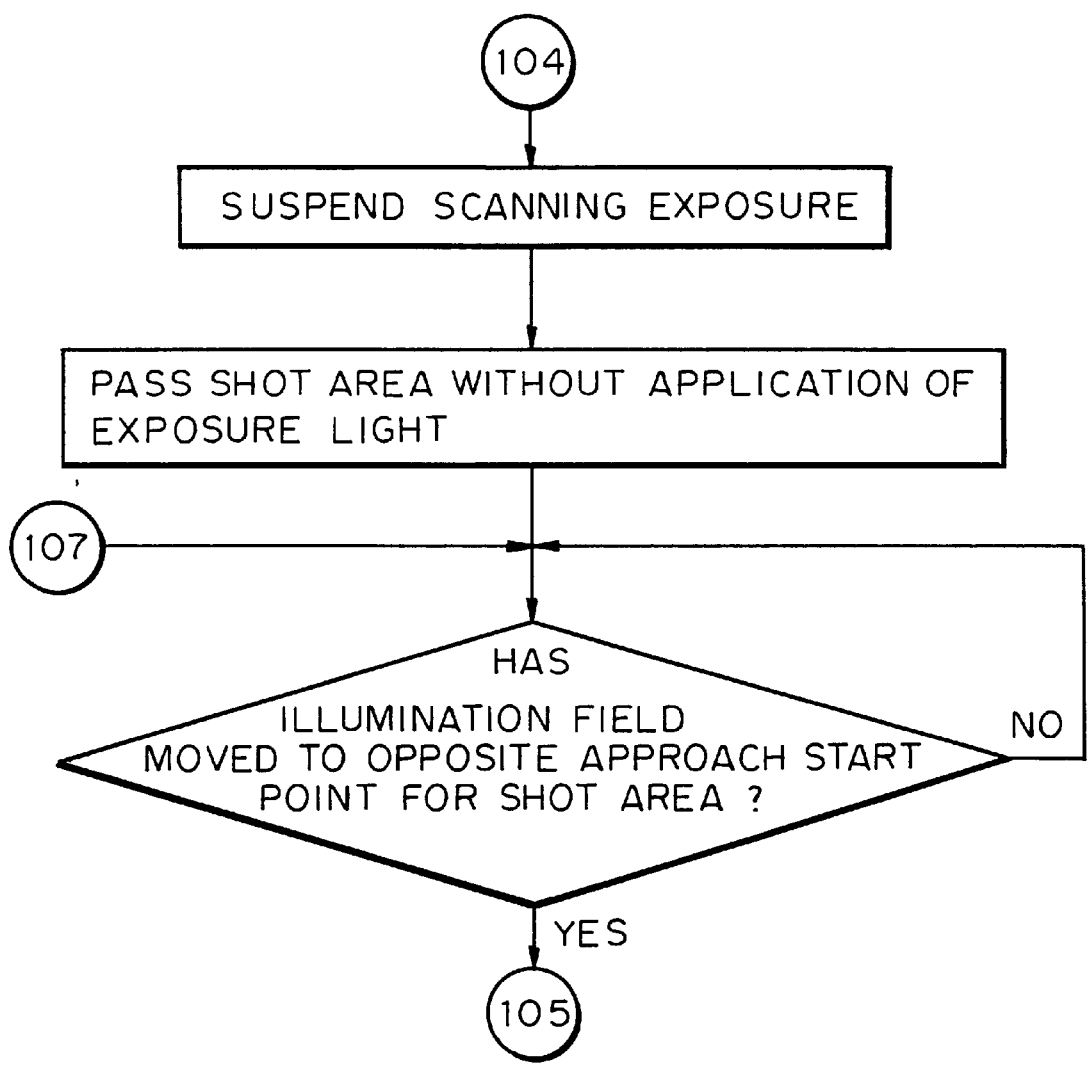
Figure 18D:
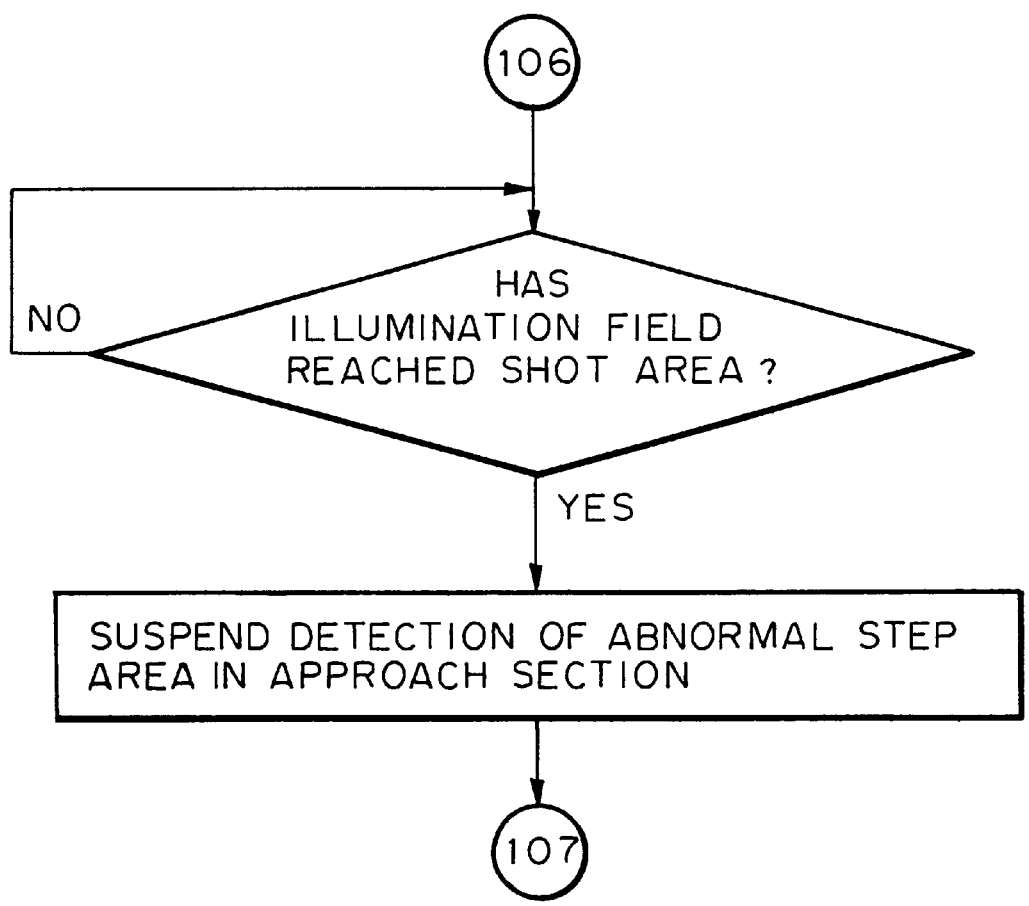
Figure 19:
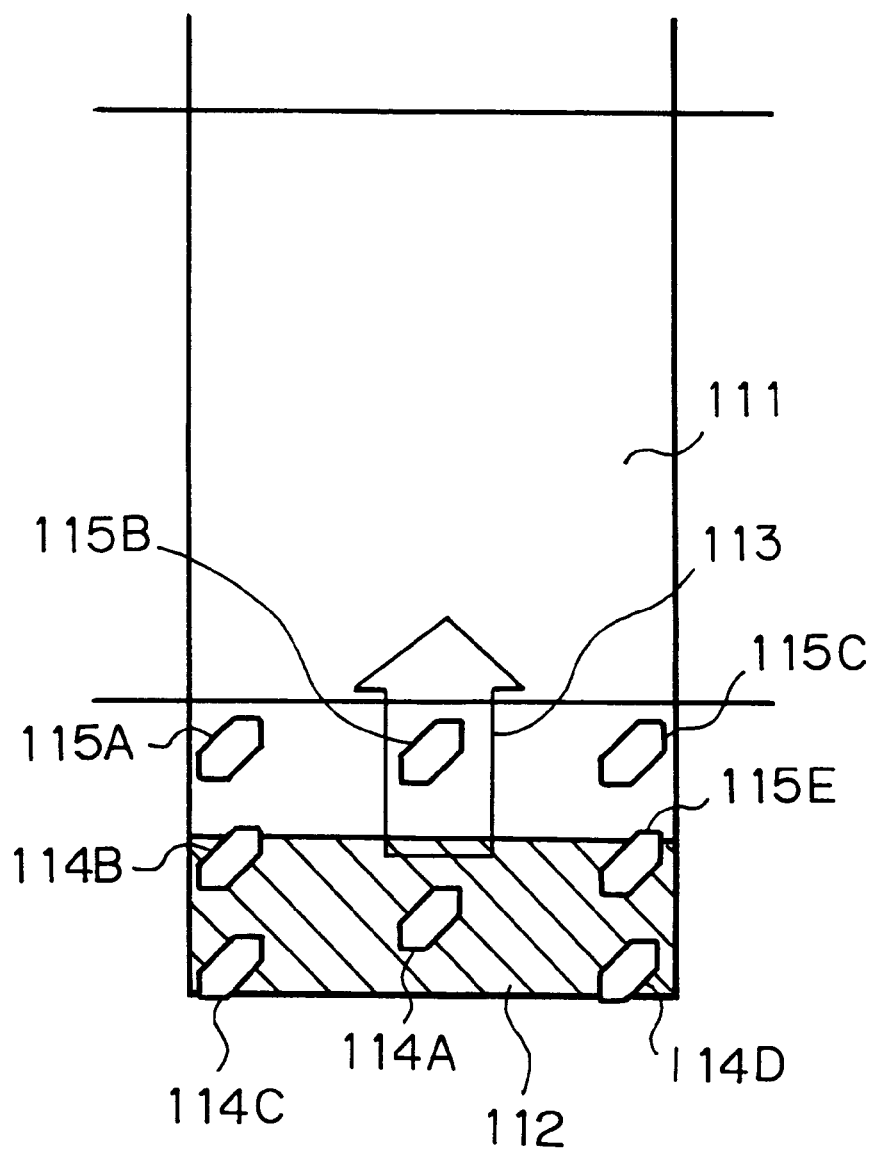
FIG. 19 is a diagram for explanation of exposure conventionally carried out to a wafer by a step-and-scan type scanning exposure apparatus.
Figure 20A:
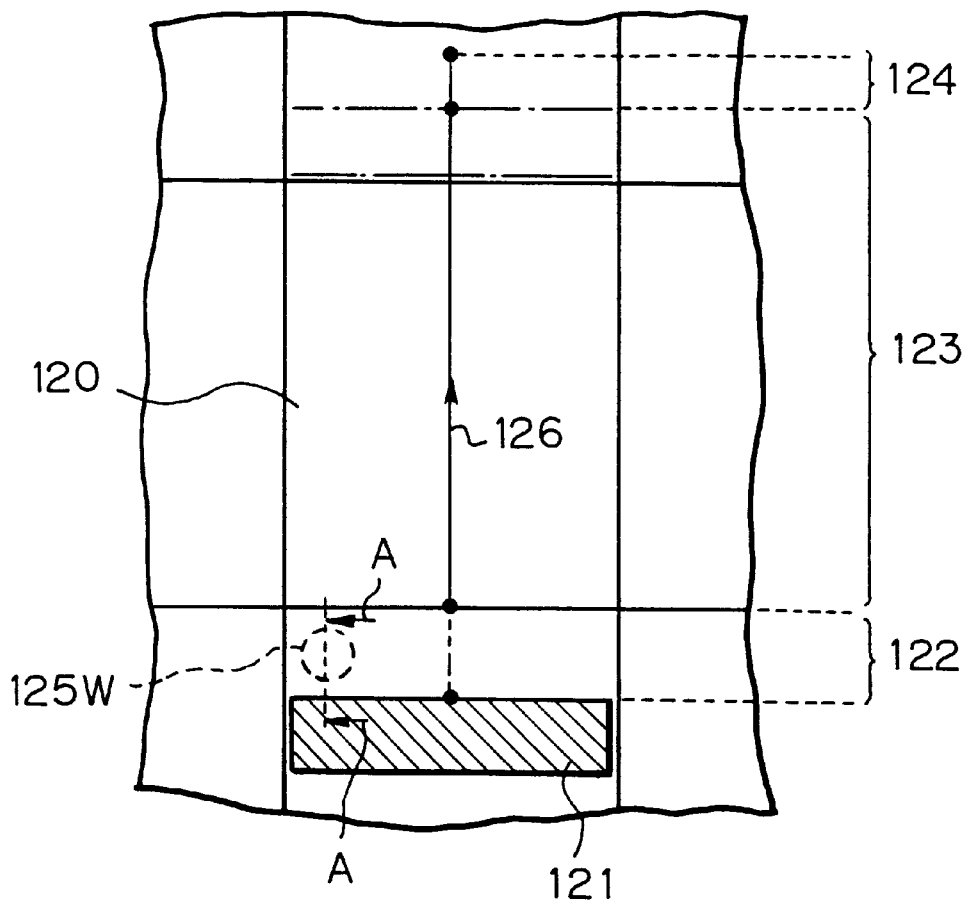
FIG. 20(a) is a diagram for explanation of exposure conventionally carried out to a wafer by a step-and-scan type scanning exposure apparatus similar to that in FIG. 19, wherein an abnormal step is present in an approach section.
Figure 20B:
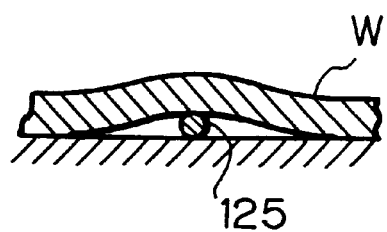
FIG. 20(b) is a fragmentary enlarged sectional view as seen from the arrow A—A in FIG. 20(a), showing the abnormal step in FIG. 20(a).

Therefore, in the case of FIG. 16, for example, assuming that the scanning direction for a pair of successive layers is set to the same direction with respect to a shot area having no abnormal step area in an approach section therefor, the exposure operation is carried out as shown in FIG. 17.

In FIG. 17, scanning exposure is carried out in the same way as in the embodiment shown in FIG. 16 up to the shot area SA24. That is, the illumination field 80 moves over the shot area SA24 in the −Y direction as far as the deceleration end point D14. Thereafter, because the scanning direction at the subsequent shot area SA25 in the preceding layer is the −Y direction as indicated by the arrow 28C, the wafer stage 9 steps diagonally to move the illumination field 80 from the deceleration end point D14 to the +Y side approach start point A15 for the shot area SA25. Thereafter, the illumination field 80 is scanned in the −Y direction to carry out exposure for the shot area SA25. Thereafter, scanning is performed in the same direction as in the preceding layer, that is, in the scanning direction specified in the original exposure sequence. Thus, the overlay accuracy in the shot area SA25 and those following it may be improved to a certain extent over the process shown in FIG. 16. Similarly, when overlay exposure is carried out in the embodiment shown in FIG. 15(*a*), the scanning direction for the shot area SA25 and those following it may be set to the same direction as in the preceding layer.

Although in the foregoing embodiments the number of detecting points detected by the multipoint AF sensor 60 is 11 in total, it should be noted that the number and arrangement of detecting points is not necessarily limited to those in the described embodiments. To measure a tilt angle of the wafer surface, it is also possible to use a parallel beam oblique incidence type leveling sensor, for example, in which a parallel beam is obliquely applied to the wafer surface, and the tilt angle of the surface is detected from the amount of transverse displacement of a position where reflected light from the wafer surface is converged. Thus, the present invention is not necessarily limited to the above-described embodiments but may adopt various arrangements without departing from the gist of the present invention.

With the scanning exposure method according to the first aspect of the present invention to attain the third object thereof, if the position (focus position) of the surface of the substrate in the optical axis direction of the projection optical system exceeds a predetermined tolerance limit during the approach operation of the substrate, scanning exposure is carried out by reversing the scanning direction. Therefore, even if an area (abnormal step area) which is markedly different in focus position from the surrounding area is present in the first approach section for the substrate, defocus is unlikely to occur in the area on the substrate. Accordingly, a resolution failure will not occur on the substrate.

Focusing of the substrate surface is performed by the autofocusing method and the autoleveling method in a case where during the approach operation of the substrate, the position of the substrate in the optical axis direction of the projection optical system is measured in at least one of the exposure light illumination area and a predetermined area adjacent to the illumination area in the movement direction of the substrate, and the surface position of the substrate is set on the basis of the result of the measurement.

With the scanning exposure method according to the second aspect of the present invention to attain the third object thereof, the movement direction of the substrate when scanning exposure is carried out for a certain shot area on the substrate is decided according to the surface configuration of a shot area adjacent to the shot area in the movement direction of the substrate. Therefore, if an abnormal step area is present in the first approach section, the scanning direction is reversed in advance. Consequently, defocus is unlikely to occur in the shot area concerned, and the throughput improves in comparison to a method in which the approach operation is retried.

In this case, the process may be carried out such that before the shot area concerned is exposed, the adjacent shot area is exposed to the mask pattern image while detecting the surface configuration of the adjacent shot area, and the movement direction of the substrate for scanning exposure to the shot area concerned is decided according to the surface configuration of the adjacent shot area detected during the scanning exposure therefor. By doing so, for the shot area concerned, scanning exposure can be performed from a direction in which the abnormal step area is not present without an unnecessary movement.

If the movement direction of the substrate for scanning exposure to a shot area to be exposed subsequently to the shot area concerned is reversed to the movement direction of the substrate for scanning exposure to the shot area concerned, a useless movement is avoided, and thus the throughput of the exposure process improves.

In a case where the movement direction of the substrate for scanning exposure to a shot area to be exposed subsequently to the shot area concerned is set to the same direction as that for scanning exposure for the subsequent shot area in the preceding layer, it may be possible to improve the overlay accuracy in shot areas containing no abnormal step area.

What is claimed is:

1. A scanning exposure method in which a substrate is exposed with an image through a projection optical system while moving said substrate, said method comprising:
   measuring, in advance of exposure for an area to be exposed on said substrate positions in a direction of an optical axis of said projection optical system at a plurality of points on a surface of said area to be exposed on said substrate, wherein said plurality of points defines a measuring area and said measuring area has substantially the same size as that of said area to be exposed; and
   setting, during scanning exposure of said area, a surface position of said substrate on the basis of said measured positions.

2. A scanning exposure method according to claim 1, wherein said positions are measured at an approach start position of said substrate for exposing of said area.

3. A scanning exposure method according to claim 2, wherein said approach start position includes an accelerating start position of said substrate and wherein said accelerating start position is set on the basis of an acceleration of said substrate during approach and a speed of said substrate during the scanning exposure.

4. A scanning exposure method according to claim 1, wherein said positions are measured between a point of time when the scanning exposure for said shot area and a point of time when scanning exposure for another area on said substrate has been completed.

5. A scanning exposure method according to claim 1, wherein after said substrate has been started to accelerate, a position of said substrate surface of said area in the optical axis direction of said projection system is remeasured, and the surface position of said substrate is set on the basis of said measured positions and said remeasured position.

6. A scanning exposure method according to claim 1, wherein said exposure is carried out in such a manner that said substrate and a mask having a pattern whose image is to be transferred onto said substrate are moved synchronously, and while doing so, the image of the pattern of said mask is transferred onto said substrate by exposure through said projection optical system.

7. A scanning exposure method according to claim 1, wherein a surface configuration of said area to be exposed is obtained on the basis of said measured positions, and wherein said surface position of said substrate is set on the basis of said obtained surface configuration during the scanning exposure.

8. A scanning exposure method according to claim 1, wherein a distribution of the plurality of points for measuring the positions in said optical axis direction is changed according to a configuration of said area to be exposed.

9. A scanning exposure method in which
   a substrate is exposed with an image through a projection optical system while moving said substrate, said method comprising:
   deciding a direction of movement of said substrate for exposing one shot area on said substrate according to a surface configuration of a shot area adjacent to said one shot area in the direction of movement of said substrate; and
   exposing said one shot area while moving said substrate in said decided direction of movement.

10. A scanning exposure method according to claim 9, wherein a direction of movement of said substrate for exposing a shot area to be exposed subsequently to said one shot area is reversed with respect to the direction of movement of said substrate for exposing said one shot area.

11. A scanning exposure method according to claim 9, wherein a direction of movement of said substrate for exposing a shot area to be exposed subsequently to said one shot area is set to the same direction as a direction of movement of said substrate in exposure carried out for a preceding photosensitive layer on said substrate at said shot area to be exposed subsequently.

12. A scanning exposure method according to claim 9, wherein said exposure is carried out in such a manner that said substrate and a mask having a pattern whose image is to be transferred onto said substrate are moved synchronously, and while doing so, the image of the pattern of said mask is transferred onto said substrate by exposure through said projection optical system.

13. A scanning exposure method according to claim 15, said method further comprising:
   exposing said adjacent shot area adjacent to one shot area while detecting the surface configuration of said adjacent shot area in advance of exposure for said one shot area; and wherein the direction of movement of said substrate for exposing said one shot area on said substrate is decided according to said detected surface configuration of said adjacent shot area.

14. A scanning exposure method in which a substrate is exposed with an image of a pattern formed on a mask, said method comprising the steps of:

moving said substrate for exposing a shot area on said substrate in the same direction as a direction of movement of said substrate in exposure carried out for a preceding layer on said substrate at said shot area; and moving said mask synchronously with said substrate so as to expose said substrate with an image of a pattern formed on said mask.

15. A scanning exposure method in which each of a plurality of shot areas on a substrate is exposed while moving said substrate, the method comprising:

carrying out an approach operation of said substrate in accordance with a predetermined exposure sequence; and detecting errors during said approach operation of said substrate, wherein one area in which the error detected during said approach operation is below a predetermined tolerance limit in said shot areas is exposed while moving said substrate in a direction defined by the predetermined exposure sequence, and another area in which the error detected during said approach operation is beyond the predetermined tolerance limit in said shot areas is exposed while moving said substrate in an opposite direction relative to the direction defined by the predetermined exposure sequence.

16. A scanning exposure method according to claim 15, wherein the direction defined by the predetermined exposure sequence is the same direction as that of said substrate when said shot areas are exposed.

17. A scanning exposure method in which a substrate is exposed with an image of a pattern formed on a mask while the substrate is moved synchronously with the mask in a predetermined direction or a direction opposite to the predetermined direction, said method comprising the steps of:

providing a mask and a substrate; and deciding a direction of a movement of said substrate for scanning exposure of said substrate according to information regarding a surface configuration of said substrate.

18. A scanning exposure method according to claim 17, said method further comprising the step of exposing a shot area on said substrate while said substrate is moved in a direction opposite to the determined direction, immediately after said suspension of the approach operation of said substrate for exposure of the shot area on said substrate.

* * * * *